(12) United States Patent
Lin et al.

(10) Patent No.: US 12,051,695 B2
(45) Date of Patent: Jul. 30, 2024

(54) SEMICONDUCTOR DEVICES HAVING GATE DIELECTRIC LAYERS OF VARYING THICKNESSES AND METHODS OF FORMING THE SAME

(71) Applicant: TAIWAN SEMICONDUCTOR MANUFACTURING CO., LTD., Hsinchu (TW)

(72) Inventors: Ta-Chun Lin, Hsinchu (TW); Kuo-Hua Pan, Hsinchu (TW); Jhon Jhy Liaw, Hsinchu County (TW); Shien-Yang Wu, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/360,166

(22) Filed: Jul. 27, 2023

(65) Prior Publication Data

US 2023/0387114 A1  Nov. 30, 2023

Related U.S. Application Data

(60) Continuation of application No. 17/717,296, filed on Apr. 11, 2022, now Pat. No. 11,742,349, which is a
(Continued)

(51) Int. Cl.
*H01L 21/00* (2006.01)
*H01L 21/8234* (2006.01)
(Continued)

(52) U.S. Cl.
CPC .. *H01L 27/0886* (2013.01); *H01L 21/823412* (2013.01); *H01L 21/823431* (2013.01);
(Continued)

(58) Field of Classification Search
CPC ......... H01L 27/0886; H01L 21/823412; H01L 21/823431
See application file for complete search history.

(56) References Cited

U.S. PATENT DOCUMENTS 8,772,109 B2  7/2014  Colinge
8,785,285 B2  7/2014  Tsai et al.
(Continued)

FOREIGN PATENT DOCUMENTS

CN          218351466 U  *  1/2023  ....... H01L 21/02148

*Primary Examiner* — Laura M Menz
(74) *Attorney, Agent, or Firm* — HAYNES AND BOONE, LLP

(57) ABSTRACT

A semiconductor device includes a substrate having a first region and a second region. Multiple nanostructures are vertically stacked above the first region of the substrate. A first gate dielectric layer wraps each of the nanostructures. A first gate electrode layer is disposed on the first gate dielectric layer. A fin protruding from the second region of the substrate. The fin includes alternating first and second semiconductor layers with different material compositions. A second gate dielectric layer is disposed on top and sidewall surfaces of the fin. A second gate electrode layer is disposed on the second gate dielectric layer. A thickness of the first gate dielectric layer is smaller than a thickness of the second gate dielectric layer.

20 Claims, 25 Drawing Sheets

Related U.S. Application Data division of application No. 16/745,107, filed on Jan. 16, 2020, now Pat. No. 11,302,692.

(51) Int. Cl.
*H01L 27/088* (2006.01)
*H01L 29/06* (2006.01)
*H01L 29/66* (2006.01)
*H01L 29/78* (2006.01)

(52) U.S. Cl.
CPC .. *H01L 21/823462* (2013.01); *H01L 29/0673* (2013.01); *H01L 29/66795* (2013.01); *H01L 29/785* (2013.01)

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,963,258 B2 | 2/2015 | Yu et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,520,482 B1 | 12/2016 | Chang et al. |
| 9,548,303 B2 | 1/2017 | Lee et al. |
| 9,576,814 B2 | 2/2017 | Wu et al. |
| 9,660,033 B1 * | 5/2017 | Chen .................... H01L 27/088 |
| 10,312,352 B2 * | 6/2019 | Chang ................ H01L 29/6656 |
| 10,615,043 B2 * | 4/2020 | Ando ................... H01L 29/513 |
| 10,629,501 B2 * | 4/2020 | Doornbos ............ H01L 29/775 |
| 10,734,286 B1 * | 8/2020 | Ando ................... H01L 29/0673 |
| 10,763,177 B1 * | 9/2020 | Zhang ................ H01L 29/0673 |
| 11,031,397 B2 * | 6/2021 | Liaw ................ H01L 29/66795 |
| 11,056,396 B1 * | 7/2021 | Wu .................. H01L 21/823462 |
| 11,205,650 B2 * | 12/2021 | Huang ............ H01L 21/823857 |
| 11,264,288 B2 * | 3/2022 | Chu .................. H01L 29/42372 |
| 11,282,945 B2 * | 3/2022 | Young .................... H01L 29/513 |
| 11,302,692 B2 * | 4/2022 | Lin ........................ H01L 29/785 |
| 11,380,772 B2 * | 7/2022 | Cheng .................... H01L 29/513 |
| 11,728,382 B2 * | 8/2023 | Liaw ............... H01L 21/823462 |
| | | 257/288 |
| 11,742,349 B2 * | 8/2023 | Lin ..................... H01L 27/0886 |
| | | 257/401 |
| 11,894,276 B2 * | 2/2024 | Lee ....................... H01L 21/022 |
| 11,908,746 B2 * | 2/2024 | Kao ................ H01L 21/823431 |
| 2002/0140047 A1 * | 10/2002 | Cappelletti ........... H01L 27/105 |
| | | 257/500 |
| 2007/0218598 A1 * | 9/2007 | Niimi ............... H01L 21/823462 |
| | | 257/E21.639 |
| 2013/0049119 A1 * | 2/2013 | Huang ........... H01L 21/823857 |
| | | 257/369 |
| 2013/0285116 A1 | 10/2013 | Lochtefeld et al. |
| 2017/0140996 A1 * | 5/2017 | Lin ........................ H01L 29/785 |
| 2019/0172751 A1 * | 6/2019 | Smith .................. H01L 27/0924 |
| 2019/0312120 A1 * | 10/2019 | Zhang ................ H01L 29/0673 |
| 2020/0043939 A1 * | 2/2020 | Wu .................. H01L 21/823462 |
| 2020/0066839 A1 * | 2/2020 | Zhang .............. H01L 21/823412 |
| 2020/0083041 A1 * | 3/2020 | Lee .................... H01L 29/66439 |
| 2020/0135740 A1 * | 4/2020 | Liaw ..................... B82Y 10/00 |
| 2020/0168715 A1 * | 5/2020 | Wu ...................... H01L 27/088 |
| 2020/0343387 A1 * | 10/2020 | Liaw ................... H01L 27/088 |
| 2020/0381432 A1 * | 12/2020 | Lee .................... H01L 29/78696 |
| 2021/0020643 A1 * | 1/2021 | Yang .................. H01L 29/0673 |
| 2021/0036144 A1 * | 2/2021 | Liaw ................ H01L 29/66439 |
| 2021/0083054 A1 * | 3/2021 | Liaw ................ H01L 29/78696 |
| 2021/0083055 A1 * | 3/2021 | Liaw ............... H01L 21/823821 |
| 2021/0098456 A1 * | 4/2021 | Huang ............ H01L 29/78696 |
| 2021/0202323 A1 * | 7/2021 | Wu ................ H01L 21/823857 |
| 2021/0225839 A1 * | 7/2021 | Lin ................ H01L 21/823462 |
| 2021/0327765 A1 * | 10/2021 | Wu ..................... H01L 27/0886 |
| 2022/0037499 A1 * | 2/2022 | Chu ................... H01L 29/4958 |
| 2022/0084830 A1 * | 3/2022 | Hsu ................ H01L 21/823462 |
| 2022/0108984 A1 * | 4/2022 | Huang ............... H01L 27/0924 |
| 2022/0238519 A1 * | 7/2022 | Lin ................ H01L 21/823462 |
| 2022/0344503 A1 * | 10/2022 | Liaw .............. H01L 21/823821 |
| 2022/0359661 A1 * | 11/2022 | Liaw .................... H01L 29/785 |
| 2023/0009347 A1 * | 1/2023 | Lin ..................... H01L 29/4983 |
| 2023/0061018 A1 * | 3/2023 | Lee ..................... H01L 27/0922 |
| 2023/0061815 A1 * | 3/2023 | Kao ................ H01L 21/823468 |
| 2023/0387114 A1 * | 11/2023 | Lin ................ H01L 21/823431 |

* cited by examiner

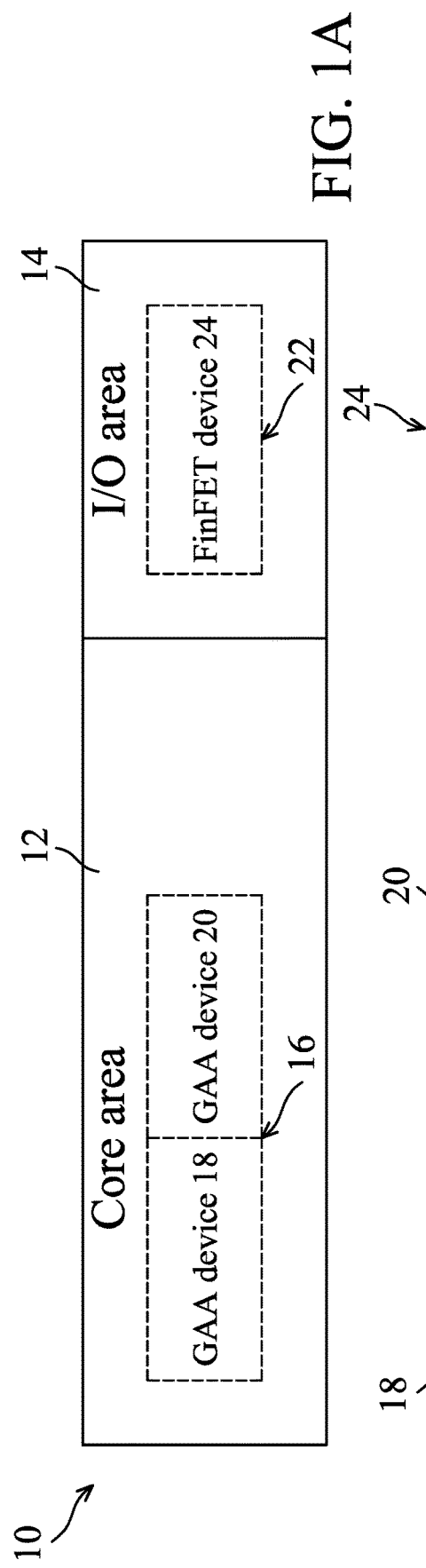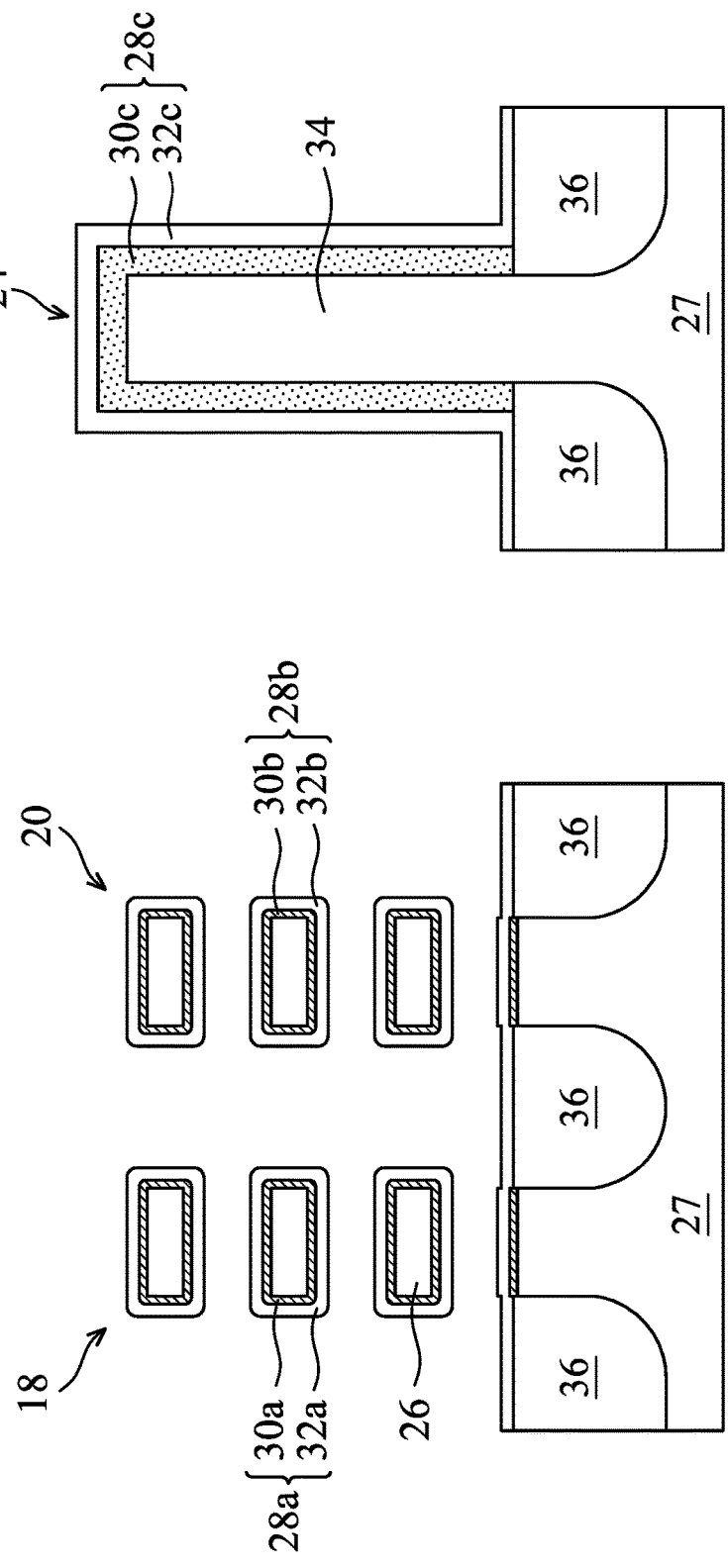

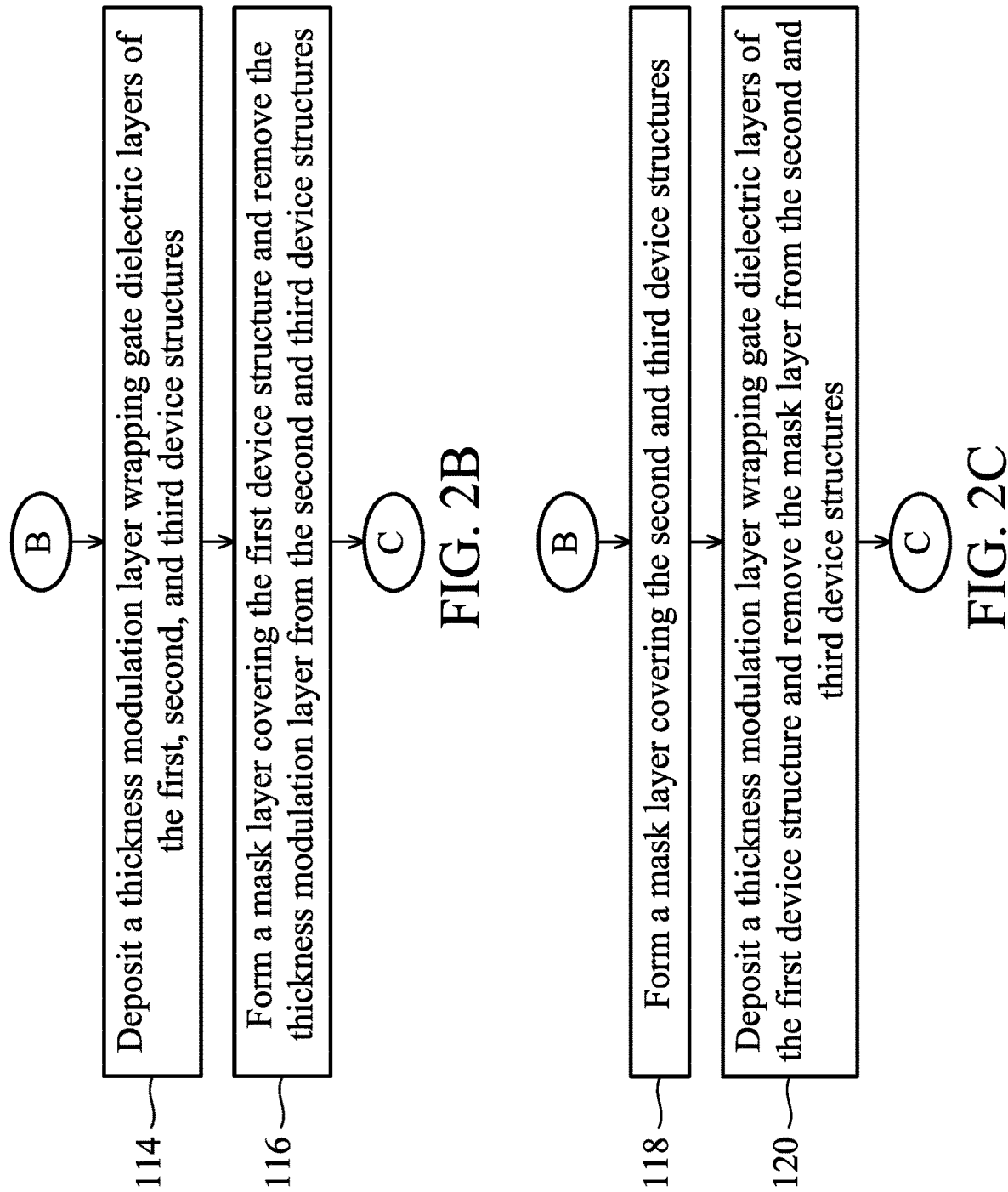

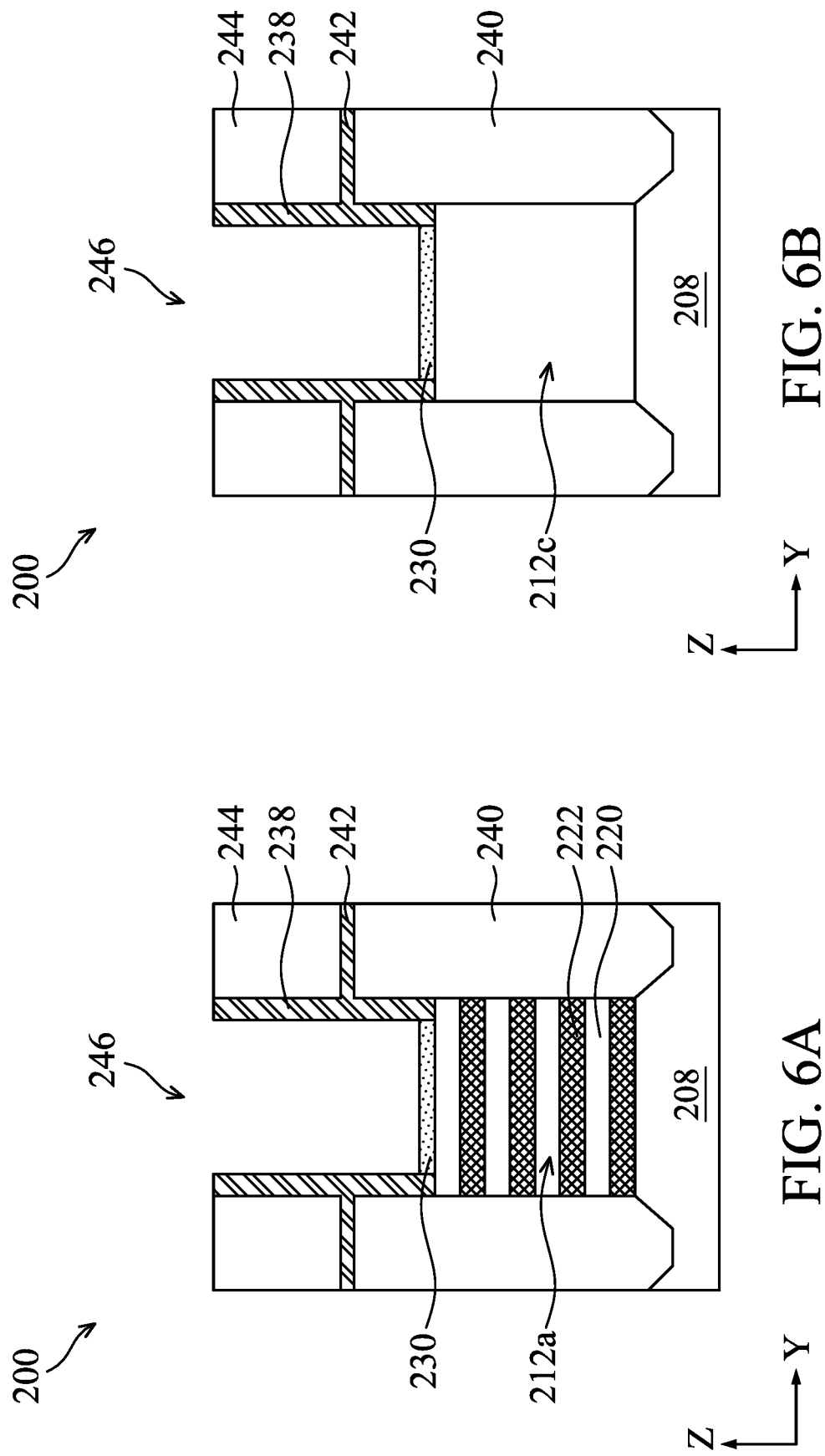

SEMICONDUCTOR DEVICES HAVING GATE DIELECTRIC LAYERS OF VARYING THICKNESSES AND METHODS OF FORMING THE SAME

PRIORITY DATA

This is a continuation application of U.S. patent application Ser. No. 17/717,296, filed Apr. 11, 2022, which is a divisional application of U.S. patent application Ser. No. 16/745,107, filed Jan. 16, 2020, now issued U.S. Pat. No. 11,302,692, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel covered by a gate on more than one side (i.e., the gate is over a top surface and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on all sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked.

IC devices include transistors that serve different functions, such as input/output (I/O) functions and core functions. These different functions require the transistors to have different constructions. At the same time, it is advantageous to have similar processes and similar process windows to fabricate these different transistors to reduce cost and improve yield. Although existing GAA transistors and processes are generally adequate for their intended purposes, they have not been entirely satisfactory in every aspect. For example, vertical spaces between adjacent nanowires (or nanosheets, other nanostructures, and/or other suitable structures) limit the thickness of the gate dielectric layer(s). For this reason, GAA transistors may not be suitable for certain applications where a thick gate dielectric layer is needed, such as for I/O functions. Further, different core functions, such as high-speed application and low-power (and/or low-leakage) application, may prefer different gate dielectric layer thicknesses for GAA transistors. Therefore, how to continuously scale down gate stacks for I/O devices and core devices with varying gate dielectric layer thicknesses suiting different applications is a challenge faced by the semiconductor industry. The present disclosure aims to solve the above issues and other related issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B shows a schematic block diagram of a semiconductor device and respective fragmentary cross-sectional view of three gate stacks for I/O and core devices, according to aspects of the present disclosure.

FIGS. 2A, 2B, 2C, 2D, 2E, and 2F show a flow chart of a method for forming the devices shown in FIGS. 1A-B, according to aspects of the present disclosure.

FIGS. 4A, 4B, 5A, 5B, 6A, 6B, 7, 8, 9, 10, 11, 12, 13, 14, 15, 16, 17, 18, 19, 20, 21, and 22 illustrate cross-sectional views of a semiconductor structure during fabrication processes according to the method of FIGS. 2A-F, in accordance with various embodiments of the present disclosure.

DETAILED DESCRIPTION

Figure 2A:
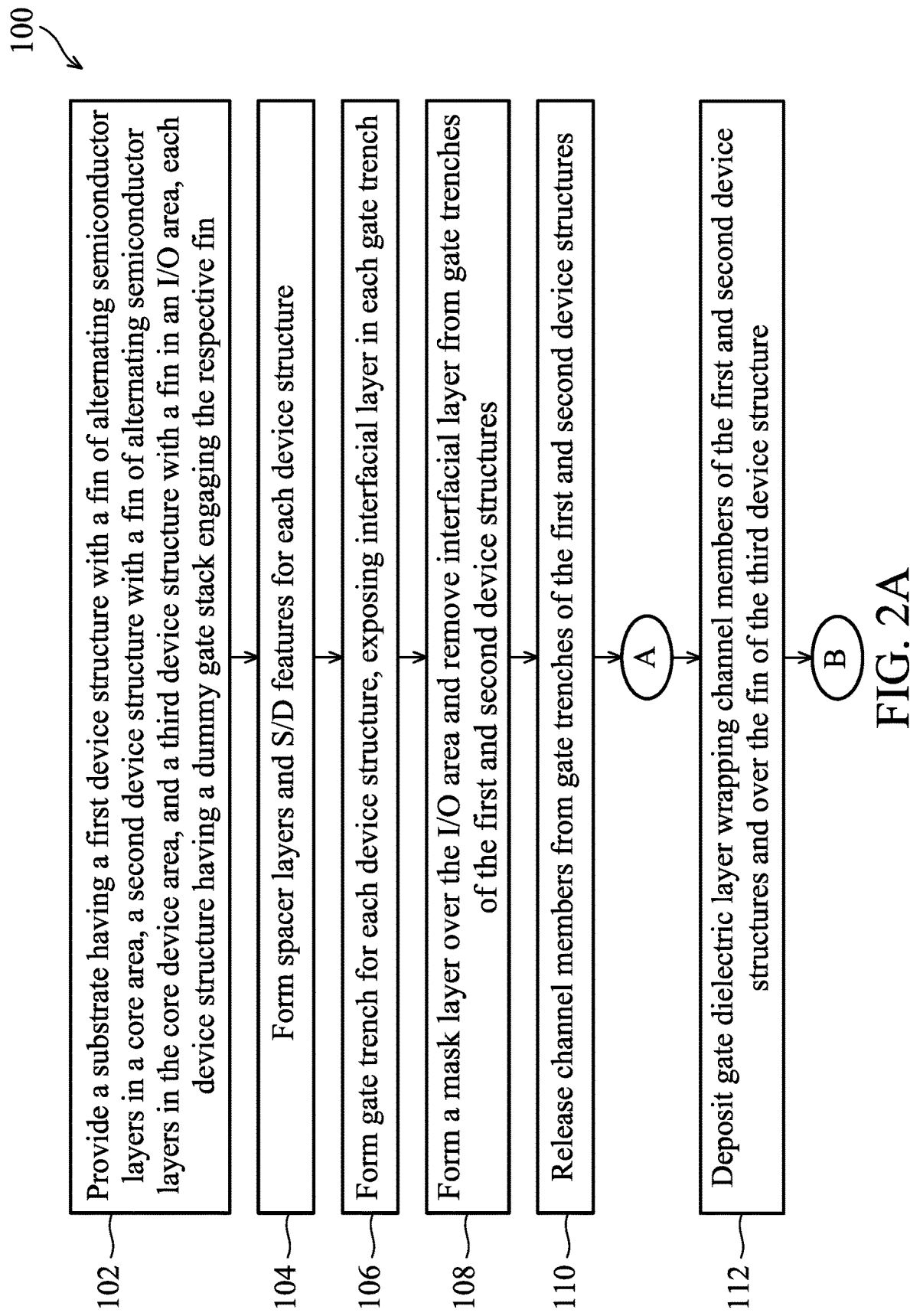
Figure 2D:
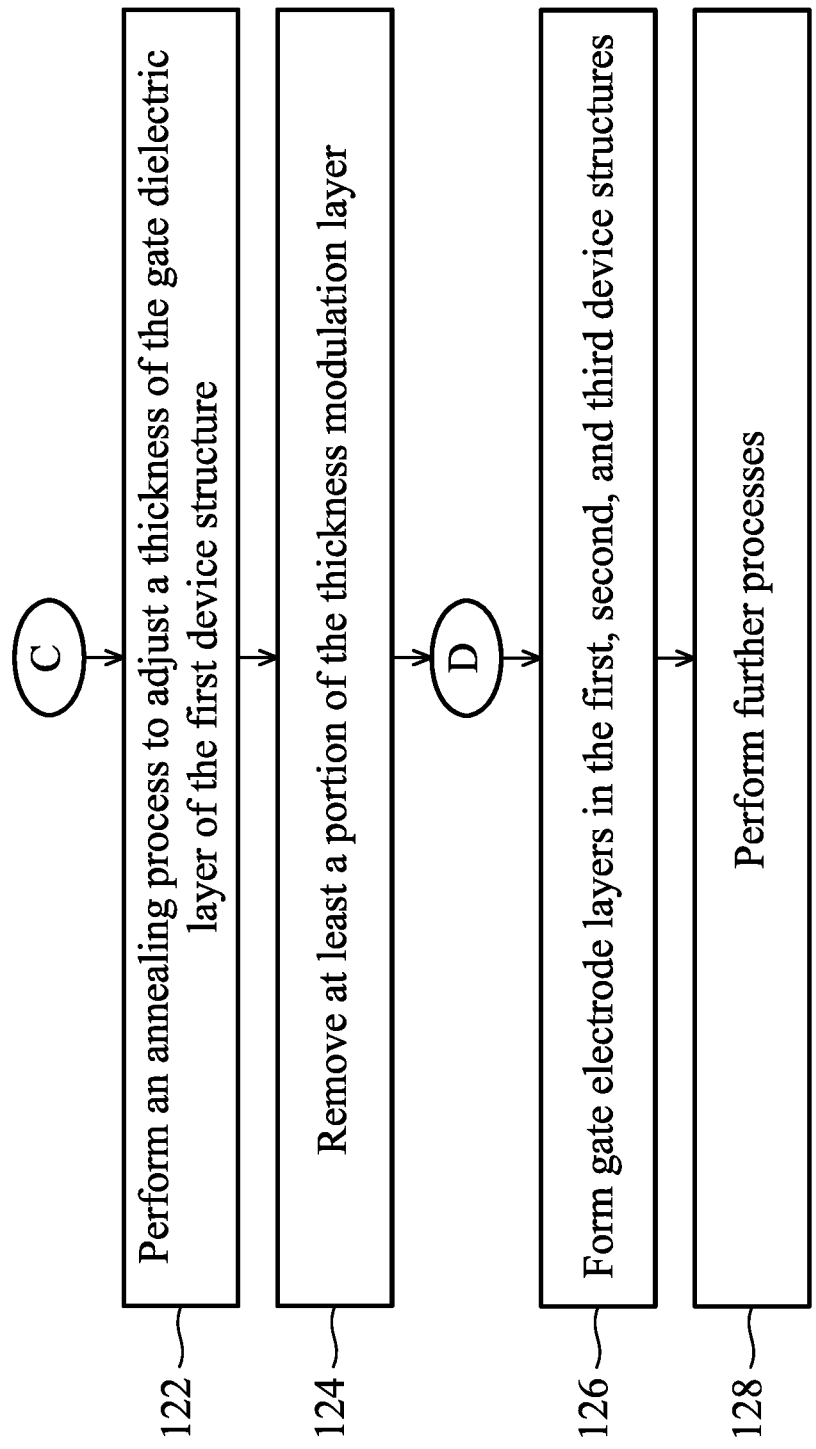

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices, and more particularly to integrate circuits (IC) having input/output (I/O) devices (or transistors) with fin (or stack fin) channels and core devices (or transistors) with nanowire channels on the same substrate. In an embodiment, at least two gate-all-around (GAA) devices with stacked nanowire channels are placed in a core area of the IC, for example, for implementing high-speed application and low-power (and/or low-leakage) application respectively, while a fin-like field effect transistor (FinFET) is placed in an I/O area of the IC for implementing I/O application (including electrostatic discharge (ESD) application).

Operating voltage for the I/O area may be similar to external voltage (voltage level of the external/peripheral circuitry) and is higher than the operating voltage of the core area. To accommodate the higher operating voltage, transistors in the I/O area may have a thicker gate dielectric layer as compared to their counterparts in the core area. For GAA transistors in the I/O area, the thicker gate dielectric layer may reduce the spacing between channel members, thus substantially reducing or even eliminating the process window to form various layers of a metal gate electrode around the channel members, resulting reduced performance. As a comparison, FinFET device is allowed to have thicker gate dielectric layer than GAA device without the concern of channel member spacing.

In the core area, thicknesses of gate dielectric layers of GAA devices correlate with circuit speed and leakage performance. With a thinner gate dielectric layer, a GAA device is more suitable for high-speed application. With a thicker gate dielectric layer, a GAA device is more suitable for low-power (and/or low-leakage) application. To further the embodiment, the GAA device for high-speed application has a thinner gate dielectric layer than the GAA device for low-power (and/or low-leakage) application. Embodiments of the present disclosure provide flexible design integration schemes to accommodate different circuits in the same IC. Fabrication methods according to the present disclosure can be readily integrated into existing semiconductor manufacturing flows. Details of the various embodiments of the present disclosure are described by reference to the FIGS. 1A-22.

Referring to FIGS. 1A and 1B collectively, shown therein is a schematic block diagram of a semiconductor structure 10 (e.g., an IC 10) constructed according to an embodiment of the present disclosure. The IC 10 includes a core area 12 and an I/O area 14. The core area 12 includes logic circuits, memory circuits, and other core circuits. The I/O area 14 includes I/O cells, ESD cells, and other circuits. The core area 12 includes a device region 16 where a GAA device 18 and a GAA device 20 are formed. In some embodiments, the GAA device 18 and the GAA device 20 are placed adjacent to each other (or abutted), as illustrated in FIG. 1B. In some other embodiments, the GAA device 18 and the GAA device 20 are separated, such as by other GAA devices therebetween or in different device regions of the core area 12. The I/O area 14 includes a device region 22 where a FinFET device 24 is formed.

Each of the two GAA devices 18 and 20 includes vertically stacked multiple channel members 26 above the substrate 27. The number of channel members 26 in each GAA device may be in a range of 2 to 10. Each of the channel members 26 includes silicon or another suitable semiconductor material. The channel members 26 of the GAA device 18 is wrapped around by a gate dielectric layer 28a, which may include an interfacial layer 30a and a high-k dielectric layer 32a. The channel members 26 of the GAA device 20 is wrapped around by a gate dielectric layer 28b, which may include an interfacial layer 30b and a high-k dielectric layer 32b. The FinFET device 24 includes a fin 34 as a channel member. The fin 34 extends from the substrate 27 through isolation structures 36 (such as shallow trench isolation (STI) features). The fin 34 is covered by a gate dielectric layer 28c, which may include an interfacial layer 30c and a high-k dielectric layer 32c. Gate electrodes (not shown) wrap around or over each of the gate dielectric layers 28a, 28b, and 28c. The gate electrode may include one or more work function metal layers and a bulk metal layer. In the illustrated embodiment, the GAA devices 18 and 20 may share the same gate electrode.

The GAA devices 18 and 20 and the FinFET device 24 have varying gate dielectric layer thicknesses. For example, the FinFET device 24 in the I/O area 14 includes a gate dielectric layer 28c of a first thickness (a capacitance equivalent thickness (CET)), which is the thickest gate dielectric layer suiting high voltage application; the GAA device 20 in the core area 12 includes a gate dielectric layer 28b of a second thickness, which is a medium thickness (a medium CET) suiting low-power and/or low-leakage application; the GAA device 18 in the core area 12 includes a gate dielectric layer 28a of a third thickness, which is the thinnest gate dielectric layer (a thinnest CET) suiting high-speed application. Accordingly, the IC 10 may be referred to as a tri-gate transistor device. To further the embodiment, within gate dielectric layers 28a, 28b, and 28c, the high-k dielectric layers 32a, 32b, and 32c may have substantially the same physical thickness (e.g., from about 20 Å to about 100 Å), while the interfacial layers 30a, 30b, and 30c have varying physical thicknesses. As an example, the interfacial layer 30b may be about 10% to about 40% thicker than the interfacial layer 30a, while the interfacial layer 30c may be at least about 50% thicker than the interfacial layer 30a. In a particular example, the interfacial layer 30a has a thickness less than or equal to about 11 Å, the interfacial layer 30b has a thickness between about 12 Å and about 15 Å, and the interfacial layer 30c has a thickness larger than or equal to about 20 Å, such as between about 20 Å and about 50 Å.

FIGS. 2A-F illustrate a flow chart of a method 100 for forming a tri-gate transistor device according to various aspects of the present disclosure. FIGS. 2A-F will be described below in conjunction with FIGS. 3-22, which are fragmentary perspective and cross-sectional views of a workpiece at various stages of fabrication according to method 100. The method 100 is merely an example, and is not intended to limit the present disclosure beyond what is explicitly recited in the claims. Additional steps can be provided before, during, and after method 100, and some of the steps described can be moved, replaced, or eliminated for additional embodiments of method 100. Additional features can be added in the semiconductor device depicted in FIGS. 3-22 and some of the features described below can be replaced, modified, or eliminated in other embodiments of the semiconductor device.

Figure 3:
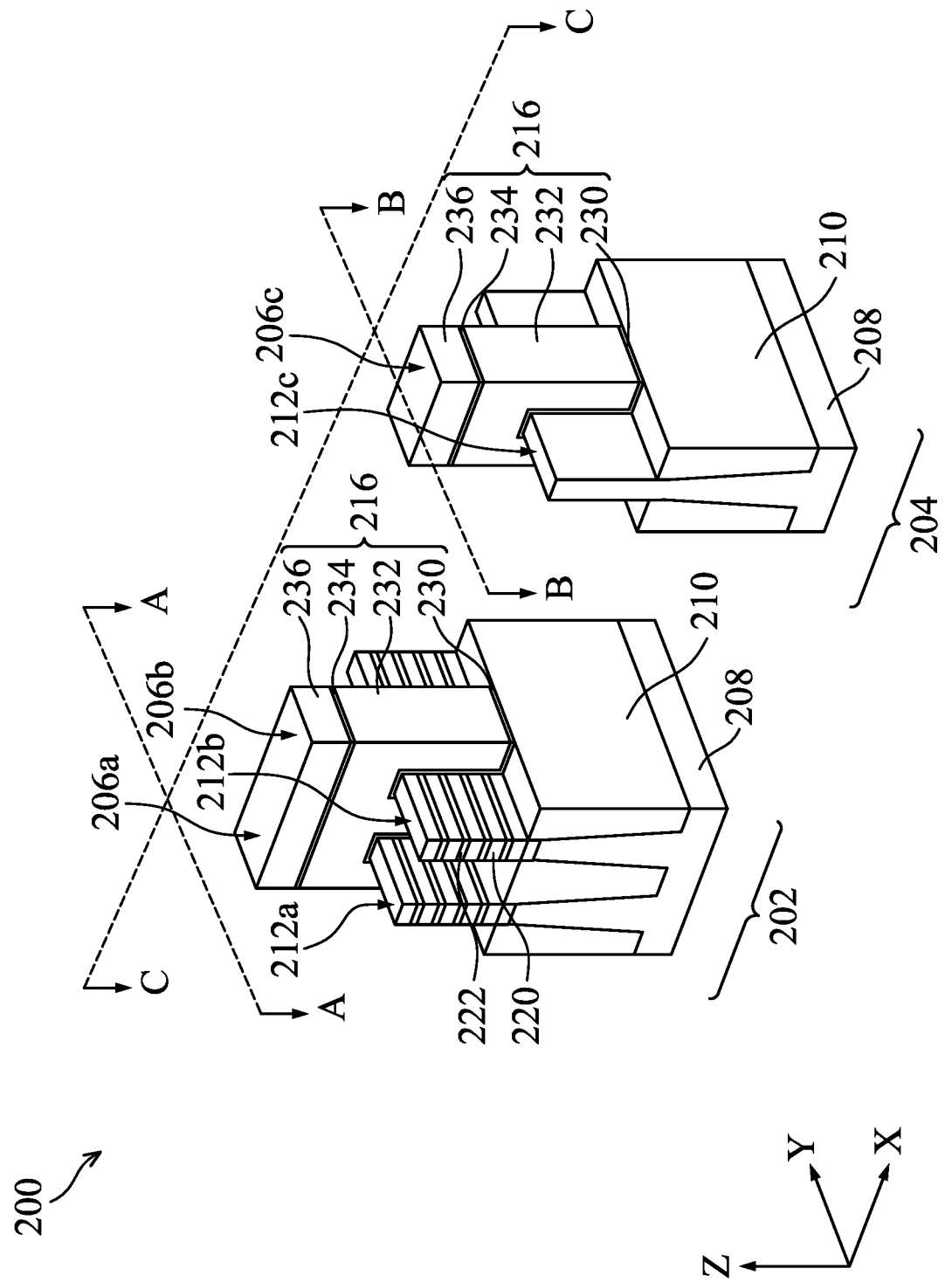
FIG. 3 shows a diagrammatic perspective view of a semiconductor device, according to aspects of the present disclosure.

At operation 102, the method 100 (FIG. 2A) provides a semiconductor structure 200 (or semiconductor device 200) that includes a first area 202 and a second area 204, as shown in FIG. 3. Each of the areas 202 and 204 includes device regions that include transistors serving different functions. In some embodiments, the first area 202 is a core area and the second area 204 is an input/output (I/O) area. In those embodiments, a core area refers to a device area that includes logic cells, such as inverter, NAND, NOR, AND, OR, and Flip-Flop, as well as memory cells, such as static random access memory (SRAM), dynamic random access memory (DRAM), and Flash. An I/O area refers to a device area that interfaces between a core device area and external/peripheral circuitry, such as the circuit on the printed circuit board (PCB) on which the semiconductor device 200 is mounted. In the illustrated embodiment, the core area 202 includes a GAA core device structure 206a for high-speed application and a GAA core device structure 206b for low-power and/or low-leakage application; the I/O area 204 includes a FinFET I/O device structure 206c.

Each of the device structures 206a, 206b, and 206c includes the substrate 208, the isolation structure 210, stacked fin 212a, 212b, or fin 212c, and a dummy gate structure 216 engaging either the stacked fin 212a, 212b, or the fin 212c.

In some embodiments, the substrate 208 includes silicon. Alternatively or additionally, substrate 208 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 208 includes one or more group III-V materials, one or more group II-IV materials, or combinations thereof. In some implementations, the substrate 208 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 208 can include various doped regions configured according to design requirements of semiconductor device 200. P-type doped regions may include p-type dopants, such as boron, indium, other p-type dopant, or combinations thereof. N-type doped regions may include n-type dopants, such as phosphorus, arsenic, other n-type dopant, or combinations thereof. In some implementations, the substrate 208 includes doped regions formed with a combination of p-type dopants and n-type dopants. The various doped regions can be formed directly on and/or in substrate 208, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices and p-type FinFET devices are formed over n-type wells, while n-type GAA devices and n-type FinFET devices are formed over p-type wells. Each of the device structures 206a, 206b, and 206c may individually be an n-type or a p-type device.

The isolation structure 210 may comprise silicon oxide, silicon nitride, silicon oxynitride, fluoride-doped silicate glass (FSG), a low-k dielectric material, and/or other suitable insulating material. The isolation structure 210 may be shallow trench isolation (STI) features. Other isolation structure such as field oxide, LOCal Oxidation of Silicon (LOCOS), and/or other suitable structures are possible. The isolation structure 210 may include a multi-layer structure, for example, having one or more thermal oxide liner layers.

Each of the stacked fins 212a and 212b has the semiconductor layers 220 and 222 alternately stacked. The first semiconductor material in the semiconductor layers 220 is different from the second semiconductor material in the semiconductor layers 222, in material and/or composition. Each of the first semiconductor material and the second semiconductor material may include silicon, germanium, a compound semiconductor including silicon carbide, gallium arsenic, gallium phosphide, indium phosphide, indium arsenide, and indium antimonide, or an alloy semiconductor including SiGe, GaAsP, AlInAs, AlGaAs, GaInAs, GaInP, and GaInAsP. In the present embodiment, the semiconductor layers 220 comprise silicon, and the semiconductor layers 222 comprise germanium or silicon germanium alloy. The semiconductor layers 220 and 222 in the stacked fins 212a and 212b may additionally include dopants (e.g., phosphorus, arsenic, boron, and/or indium) for improving the performance of the GAA transistor to be formed.

The stacked fins 212a and 212b can be formed by epitaxially growing the semiconductor layers 220 and 222 over the substrate 208 and then patterned by any suitable method to form the individual stacked fins 212a and 212b. The fin 212c may also be formed by patterning the substrate 208 in a similar patterning process. For example, each of the stacked fins 212a, 212b, and the fin 212c may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the stacked fins 212a, 212b and fin 212c by etching the initial semiconductor layers 220, 222 and the substrate 208. The etching process may include dry etching, wet etching, reactive ion etching (RIE), and/or other suitable processes.

The dummy gate structure 216 reserves an area for a metal gate stack and includes an interfacial layer 230, a dummy gate electrode 232, a first gate hard mask layer 234, and a second gate hard mask layer 236. The interfacial layer 230 is formed over top and sidewall surfaces of each of the stacked fins 212a, 212b, and the fin 212c and over the top surface of the isolation structure 210. The interfacial layer 230 may include a dielectric material such as an oxide layer (e.g., $SiO_2$) or oxynitride layer (e.g., SiON), and may be deposited by chemical oxidation, thermal oxidation, atomic layer deposition (ALD), chemical vapor deposition (CVD), and/or other suitable methods. After the deposition, the interfacial layer 230 may further go through a post oxide annealing (POA) process to improve gate oxide quality. In the illustrated embodiment, the interfacial layer 230 has a thickness suitable for I/O applications, such as a thickness larger than or equal to about 20 Å. As to be shown later on, the interfacial layer 230 remains on the fin 212c in subsequent processes as an I/O oxide layer for the FinFET I/O device structure 206c, while other portions of the interfacial layer 230 will be removed from the stacked fins 212a and 212b.

The dummy gate electrode 232 may include poly-crystalline silicon (poly-Si) and may be formed by suitable deposition processes such as low-pressure chemical vapor deposition (LPCVD) and plasma-enhanced CVD (PECVD).

Each of the gate hard mask layers 234 and 236 may include one or more layers of dielectric material such as silicon oxide and/or silicon nitride, and may be formed by CVD or other suitable methods. For example, the first gate hard mask layer 234 may include a silicon oxide layer adjacent the dummy gate electrode 232 and the second gate hard mask layer 236 may include a silicon nitride layer. The various layers 230, 232, 234, and 236 may be patterned by photolithography and etching processes.

Figure 4B:
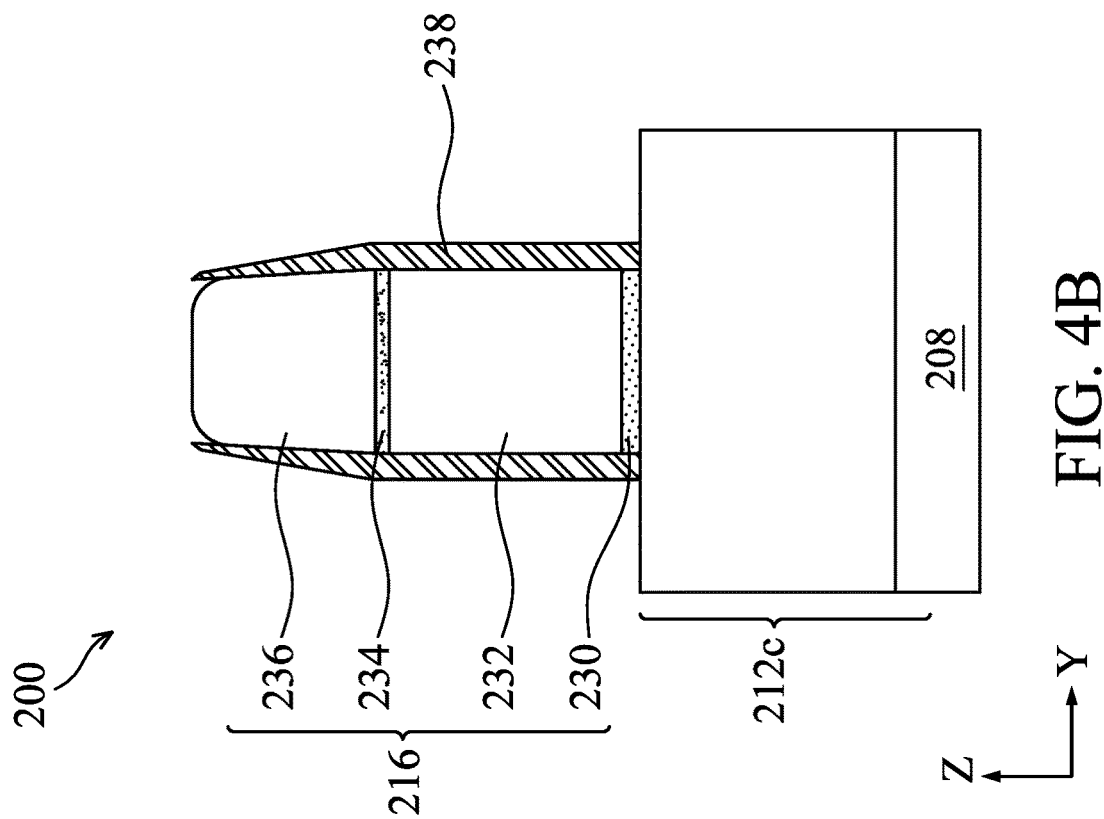
Figure 4A:
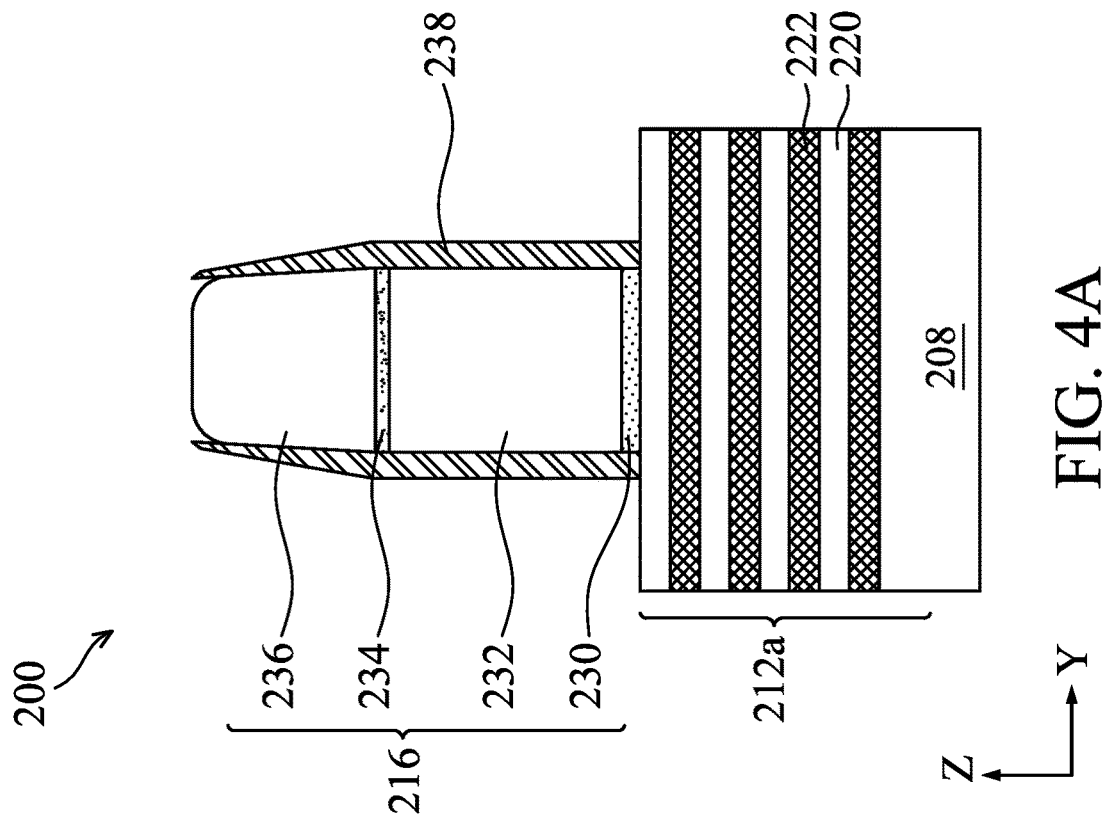
Figure 5A:
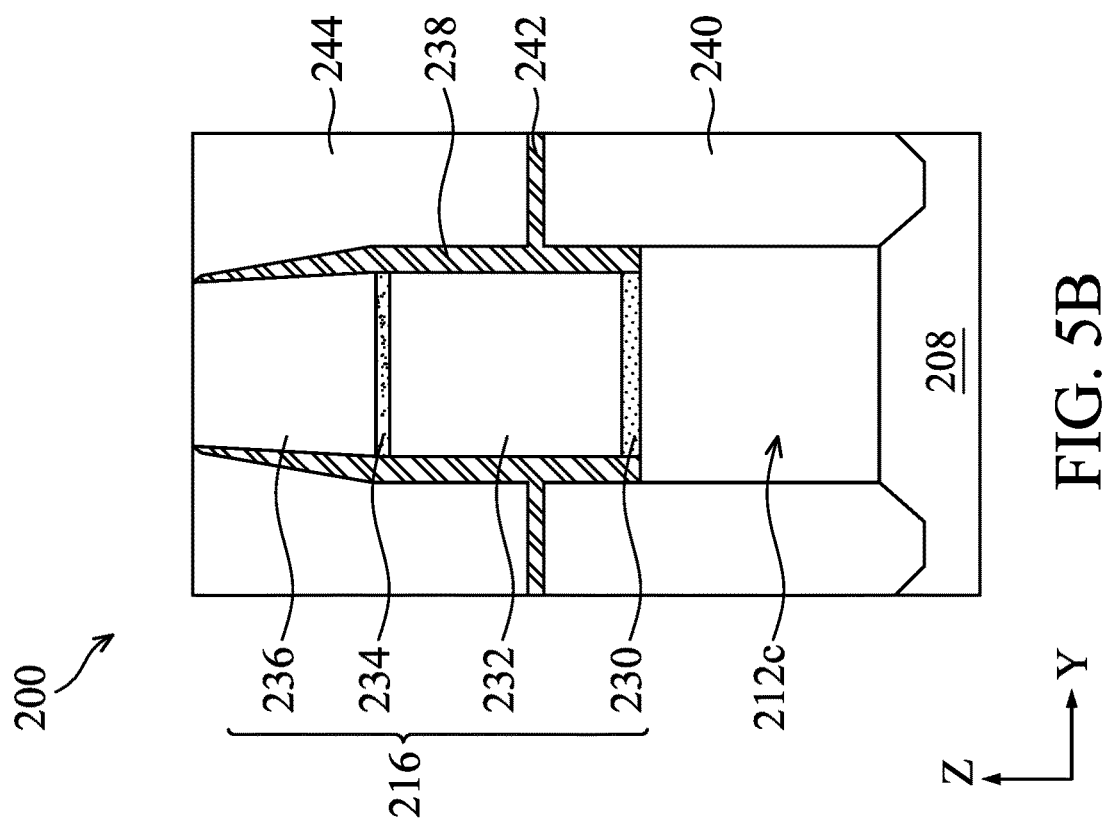
Figure 5B:
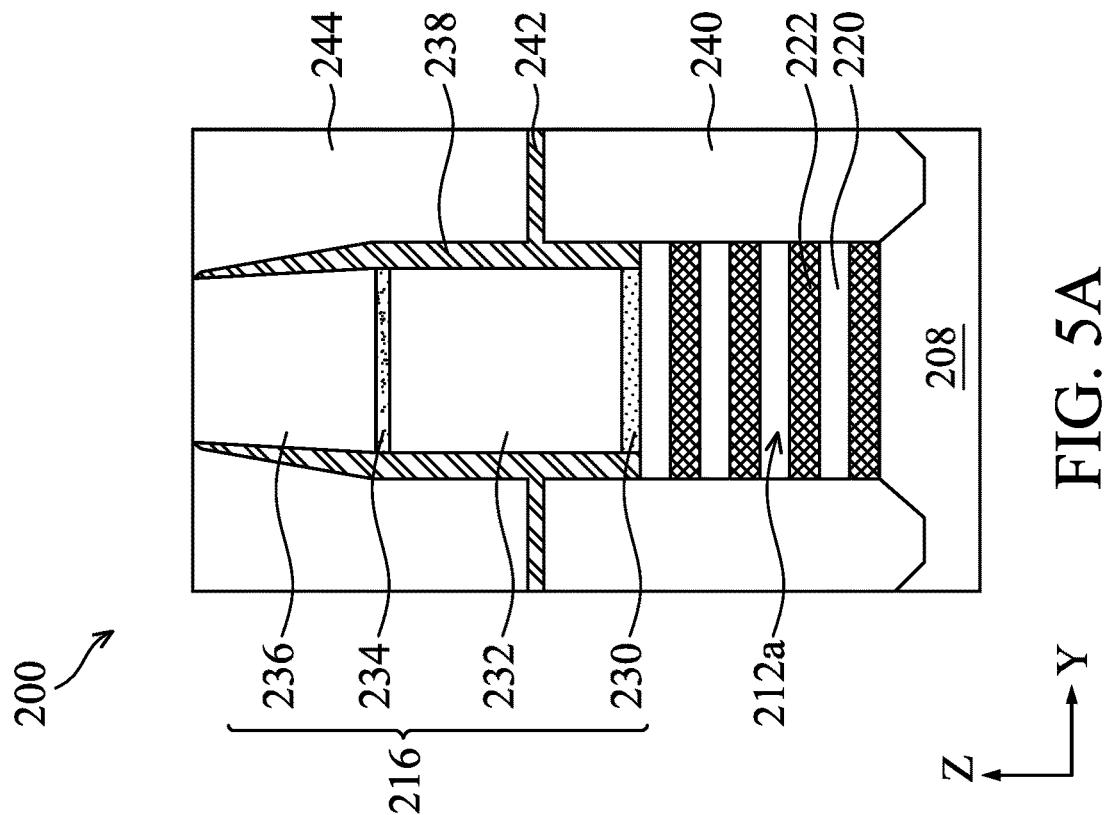

For clarity of description and illustration, FIGS. 4A, 5A, and 6A include fragmentary cross-sectional views of the GAA core device structure 206a along the section A-A shown in FIG. 3, which passes the respective channel region along the lengthwise direction of the stacked fin 212a (in Y-Z plane). FIGS. 4B, 5B, and 6B include a fragmentary cross-sectional view of the FinFET I/O device structure 206c along the section B-B shown in FIG. 3, which passes the respective channel region along the lengthwise direction of the fin 212c (in Y-Z plane). FIGS. 7-22 include fragmentary cross-sectional views of the semiconductor device 200 along the section C-C shown in FIG. 3, which passes multiple channel regions along a direction perpendicular to the lengthwise direction of the stacked fins 212a, 212b, and the fin 212c (in X-Z plane).

At operation 104, the method 100 (FIG. 2A) forms the gate spacers 238 over the sidewalls of the dummy gate structure 216, as shown in FIGS. 4A and 4B. The gate spacers 238 may comprise a dielectric material, such as silicon oxide, silicon nitride, silicon oxynitride, silicon carbide, other dielectric material, or combinations thereof, and may comprise one or multiple layers of material. The gate spacers 238 may be formed by depositing a spacer material as a blanket over the semiconductor device 200. Then the spacer material is etched by an anisotropic etching process. Portions of the spacer material on the sidewalls of the dummy gate structure 216 become the gate spacers 238. Operation 104 further forms S/D features 240 in the S/D regions, as shown in FIGS. 5A and 5B. For example, operations 104 may etch recesses into the stacked fins 212a, 212b, and the fin 212c, and epitaxially grow semiconductor materials in the recesses. The semiconductor materials may be raised above the top surface of the respective fins. Operation 104 may form the S/D features 240 separately for n-type and p-type devices. For example, Operation 104 may form the S/D features 240 with an n-type doped silicon for n-type devices, and with a p-type doped silicon germanium for p-type devices. Operation 104 may further form contact etch stop (CESL) layer 242 over the S/D features 240 and inter-layer dielectric (ILD) layer 244 over the CESL layer 242. The CESL layer 242 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. A CMP process may follow operation 104 to remove excessive dielectric materials. In some embodiments, the CMP process also removes the gate hard masks 234 and 236 and exposes the dummy gate electrode 232.

Figure 7:
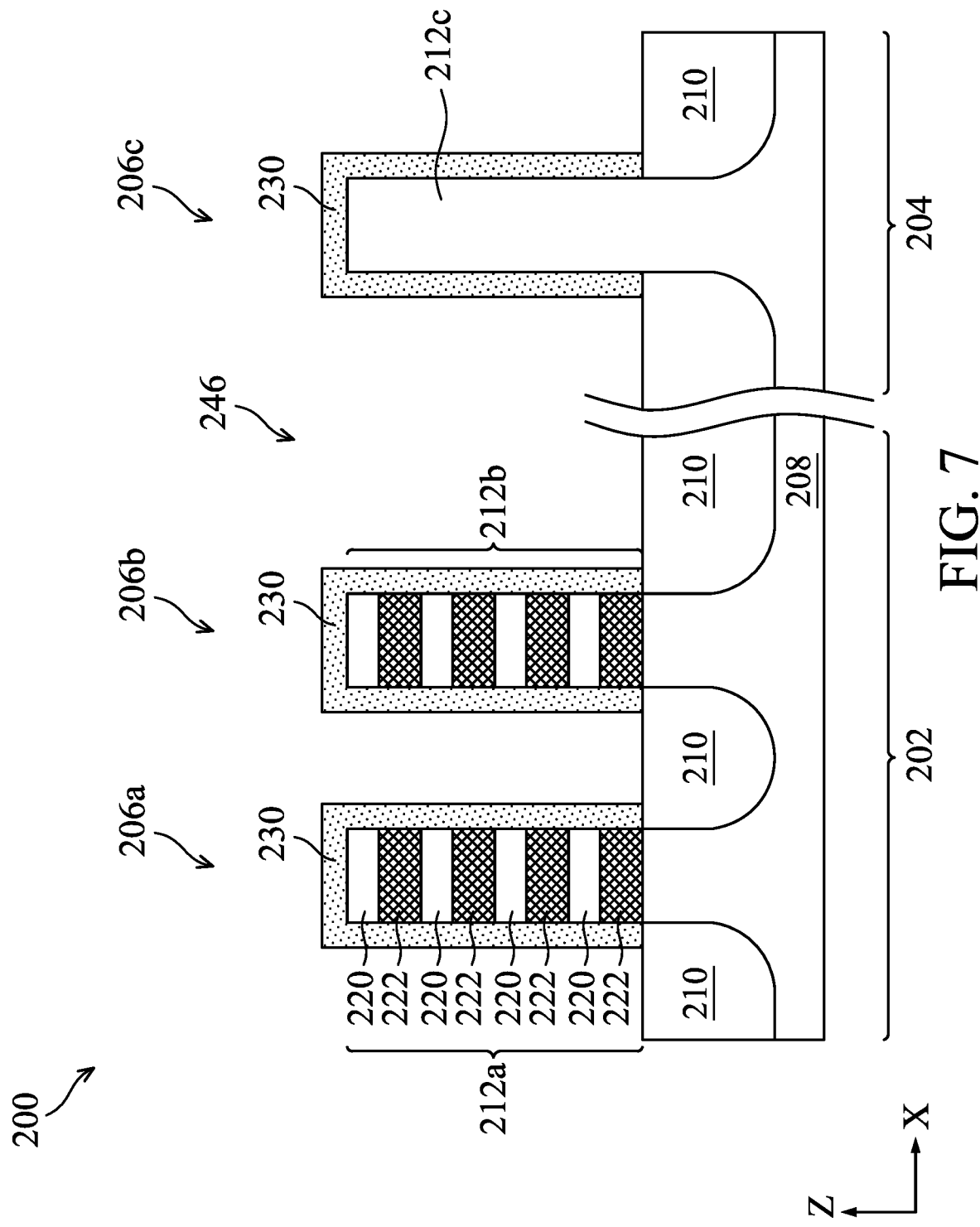

At operation 106, the method 100 (FIG. 2A) removes the dummy gate electrode 232, resulting in gate trenches 246, as shown in FIGS. 6A and 6B. Operation 106 may include one or more etching processes that are selective to the material in the dummy gate electrode 232. By selecting an etchant that resists etching the gate spacers 238 and ILD layer 244, portions of the gate spacers 238 and ILD layer 244 adjacent to the dummy gate electrode 232 are exposed in the gate trenches 246 without substantial etching loss. This may increase the tolerance of the photolithographic process. The etching process may include any suitable etching technique such as wet etching, dry etching, RIE, ashing, and/or other etching methods. In an example, the etching process is a dry etching process using a fluorine-based etchant (e.g., $CF_4$, $CHF_3$, $CH_2F_2$, etc.). After operation 106, the interfacial layer 230 that covers stacked fins 212a, 212b, and the fin 212c is exposed in the gate trenches 246, also as shown in FIG. 7.

Figure 8:
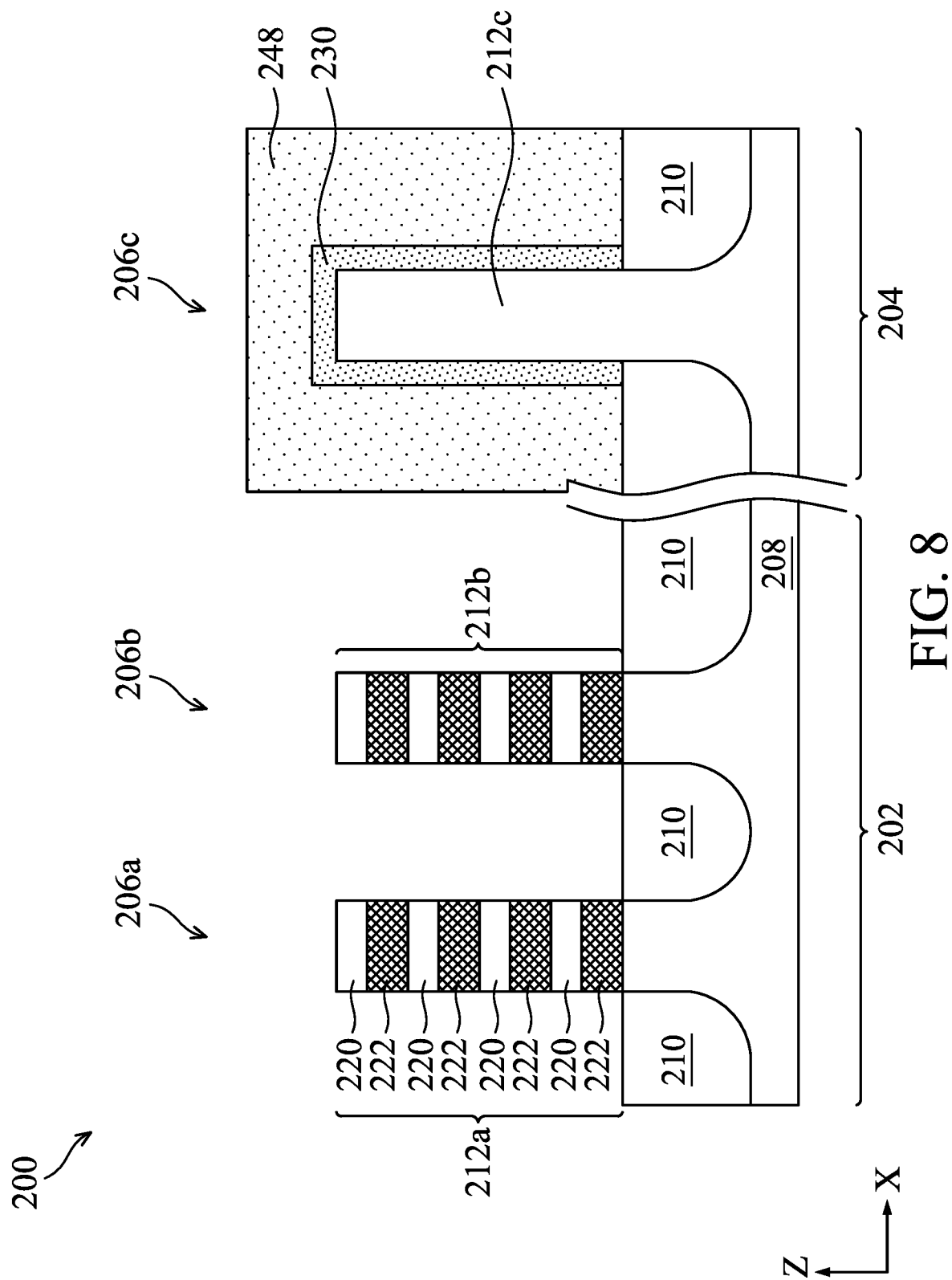

At operation 108, the method 100 (FIG. 2A) forms a mask layer 248 over the I/O area and removes the interfacial layer 230 from the stacked fins 212a and 212b, as shown in FIG. 8. The interfacial layer 230 may be removed, for example, by wet etching, dry etching, reactive ion etching, or other suitable etching methods. For example, the operation 108 may apply HF-based wet etchant(s) for wet etching or $NH_3$ and $H_2$ mixture for dry etching. During this operation, the mask layer 248 covers the interfacial layer 230 on the fin 212c. In some embodiments, the mask layer 248 is a photoresist layer, such as a bottom antireflective coating (BARC) layer. After operation 108, mask layer 248 may be removed, such as by etching, ashing, or resist stripping.

Figure 9:
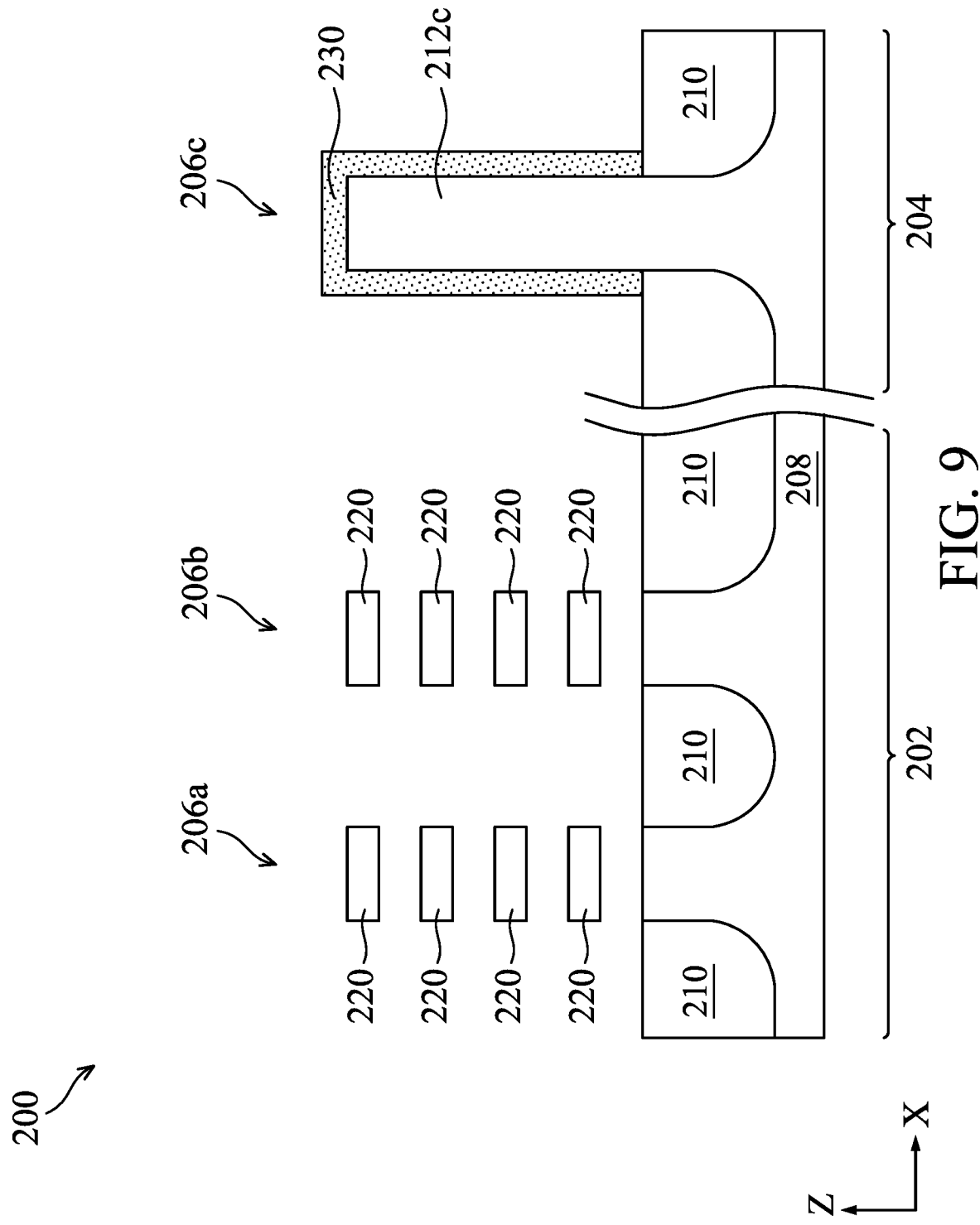
Figure 10:
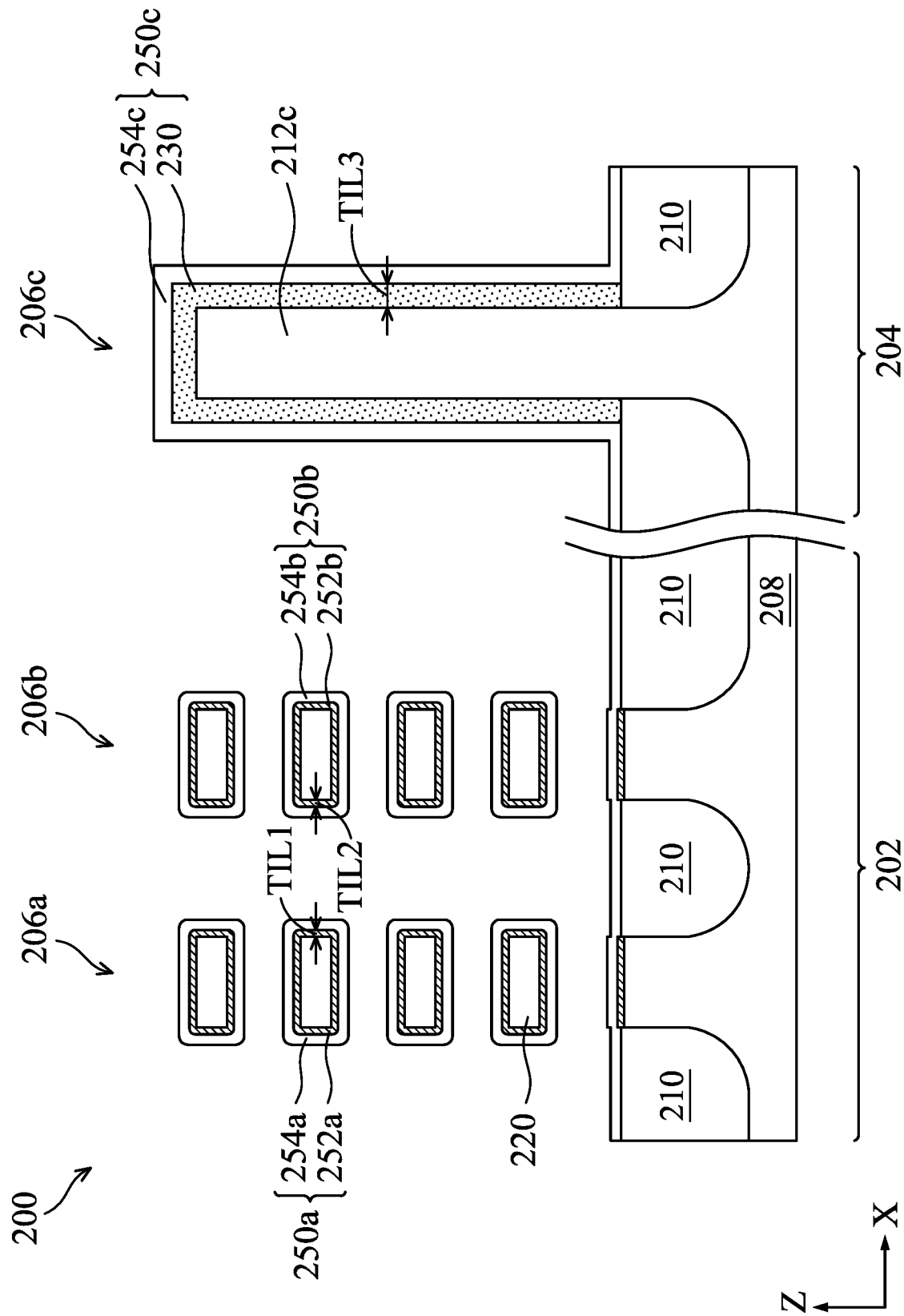

At operation 110, the method 100 (FIG. 2A) releases channel members in the GAA core device structures 206a and 206b, as shown in FIG. 9. In the illustrated embodiment, channel members are nanowires. The term nanowire (or channel member) is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For the sake of simplicity and clarity, the semiconductor layers 220 are denoted as nanowires 220 after operation 110. In the present embodiment, the semiconductor layers 220 include silicon, and the semiconductor layers 222 include silicon germanium. The plurality of semiconductor layers 222 may be selectively removed. In some implementations, the selectively removal process includes oxidizing the plurality of semiconductor layers 222 using a suitable oxidizer, such as ozone. Thereafter, the oxidized semiconductor layers 222 may be selectively removed. To further this embodiment, the operation 110 includes a dry etching process to selectively remove the semiconductor layers 222, for example, by applying an HCl gas at a temperature of 500° C. to 700° C., or applying a gas mixture of $CF_4$, $SF_6$, and $CHF_3$. The interfacial layer 230 protects the fin 212c in the FinFET I/O device structure 206c from substantial etching loss during operation 110.

At this point, as shown in FIG. 9, vertically stacked nanowires 220 are formed in the channel region of the GAA core device structure 206a and in the channel region of the GAA core device structure 206b. Although FIG. 9 illustrates four nanowires 220 for each GAA core device structure, there may be less or more vertically stacked nanowires 220 in various embodiments. For example, the number of nanowires 220 in each GAA core device structure may be in a range of 2 to 10.

At operation 112, the method 100 (FIG. 2A) forms gate dielectric layers 250a, 250b, and 250c (collectively, gate dielectric layers 250) in channel regions of the GAA core device structure 206a, GAA core device structure 206b, and FinFET I/O device structure 206c, respectively. The gate dielectric layer 250a includes an interfacial layer 252a wrapping nanowires 220 of the GAA core device structure 206a and a high-k dielectric layer 254a wrapping the interfacial layer 252a. The gate dielectric layer 250b includes an interfacial layer 252b wrapping nanowires 220 of the GAA core device structure 206b and a high-k dielectric layer 254b wrapping the interfacial layer 252b. The gate dielectric layer 250c includes the existing interfacial layer 230 that covers a top and sidewall surfaces of the fin 212c and a high-k dielectric layer 254c covers the interfacial layer 230. The interfacial layers 252a, 252b, and the high-k dielectric layers 254a, 254b, 254c (collectively, high-k dielectric layer 254) are deposited as substantially conformal layers in the illustrated embodiment.

The interfacial layers 252a and 252b may include a dielectric material such as an oxide layer (e.g., $SiO_2$) or oxynitride layer (e.g., SiON), and may be deposited by chemical oxidation, thermal oxidation, atomic layer deposition (ALD), chemical vapor deposition (CVD), and/or other suitable methods. In some embodiments, a thickness TIL1 of the interfacial layer 252a and a thickness TIL2 of the interfacial layer 252b are substantially the same, and are both smaller than a thickness TIL3 of the interfacial layer 230. Operation 112 may further increase thickness of the interfacial layer 230, such as by consuming extra silicon on outer surfaces of the fin 212c. In some embodiments, TIL3 increases about 20% to about 60%. As a specific example, TIL1 and TIL2 are in a range from about 12 Å to about 14 Å, and TIL3 grows from larger than about 15 Å to larger than or equal to about 20 Å, such as in a range from about 20 Å to about 50 Å.

The high-k dielectric layer 254 may be deposited using any suitable technique, such as ALD, CVD, metal-organic CVD (MOCVD), PVD, thermal oxidation, combinations thereof, and/or other suitable techniques. The high-k dielectric layer 254 may include a metal oxide (e.g., LaO, AlO, ZrO, TiO, $Ta_2O_5$, $Y_2O_3$, $SrTiO_3$ (STO), $BaTiO_3$ (BTO), BaZrO, HfZrO, HfLaO, HfTaO, HfTiO, $(Ba,Sr)TiO_3$ (BST), $Al_2O_3$, etc.) a metal silicate (e.g., HfSiO, LaSiO, AlSiO, etc.), a metal or semiconductor nitride, a metal or semiconductor oxynitride, combinations thereof, and/or other suitable materials. In a specific example, the high-k dielectric layer 254 has a thickness ranging from about 15 Å to about 30 Å.

Figure 11:
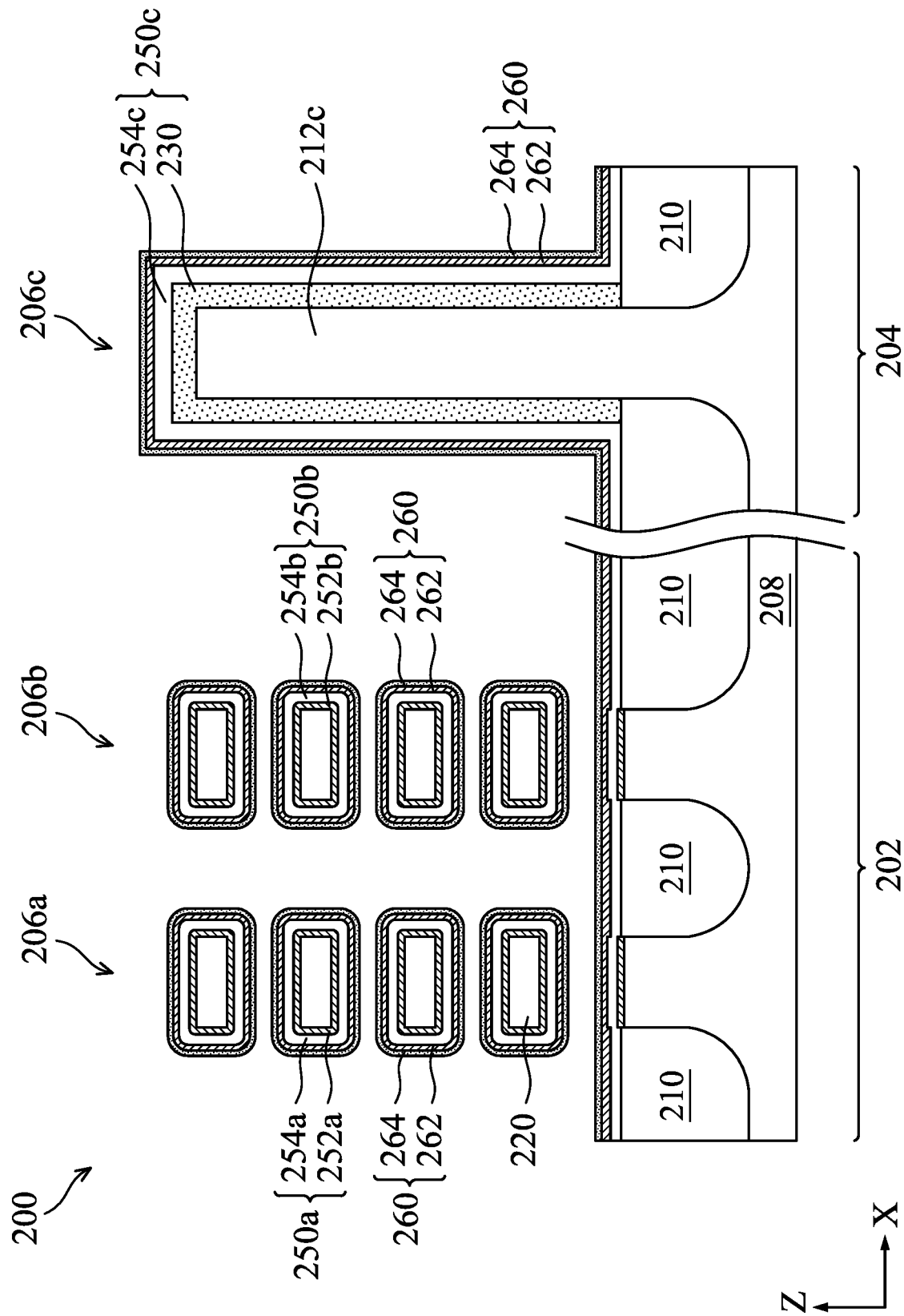

At operation 114, the method 100 (FIG. 2B) forms a thickness modulation layer 260 wrapping the gate dielectric layers 250a, 250b in the core area and covering the gate dielectric layer 250c in the I/O area, as shown in FIG. 11. The thickness modulation layer 260 may include one or more material layers. In the illustrated embodiment, the thickness modulation layer 260 includes an oxygen-scavenging layer 262 and a capping layer 264.

The oxygen-scavenging layer 262 is deposited on the high-k dielectric layer 254. The oxygen-scavenging layer 262 has a higher affinity for oxygen than the metal in the metal-oxide (in the high-k gate dielectric layer) and silicon (in the interfacial layer). The oxygen-scavenging layer 262 may include a metal or a metal compound such as Ti, Hf, Zr, Ta, Al, or combinations thereof such as TiAl. The oxygen-scavenging layer 262 may also be formed of a metal nitride (e.g. TiN, TaN, TaSiN, TiSiN), or a nitride of a metal alloy such as TiAlN. In some embodiments, the oxygen-scavenging layer 262 may be a silicon layer. In a specific example, the oxygen-scavenging layer 262 includes TiSiN that is metal rich (such as a Ti:N ratio of about 1.05:1 to about 2:1). The deposition methods include physical vapor deposition, CVD, or ALD. As to be shown later on, the oxygen-scavenging layer 262 has the function of scavenging oxygen from interfacial layer 252a at elevated temperatures.

In accordance with some embodiments of the present disclosure, the capping layer 264 is formed on top of the oxygen-scavenging layer 262 to prevent the oxidation of the oxygen-scavenging layer 262 in ambient atmosphere, wherein the oxidation may occur before, during, or after the subsequent scavenging anneal. The capping layer 264 may comprise metal or metal compound such as Ti, Co, Al, Zr, La, Mg, other reactive metal, or combinations thereof. The oxygen-scavenging layer 262 and the capping layer 264 are formed of different materials, although some of their candidate materials may be the same. In alternative embodiments, no capping layer is formed.

Figure 12:
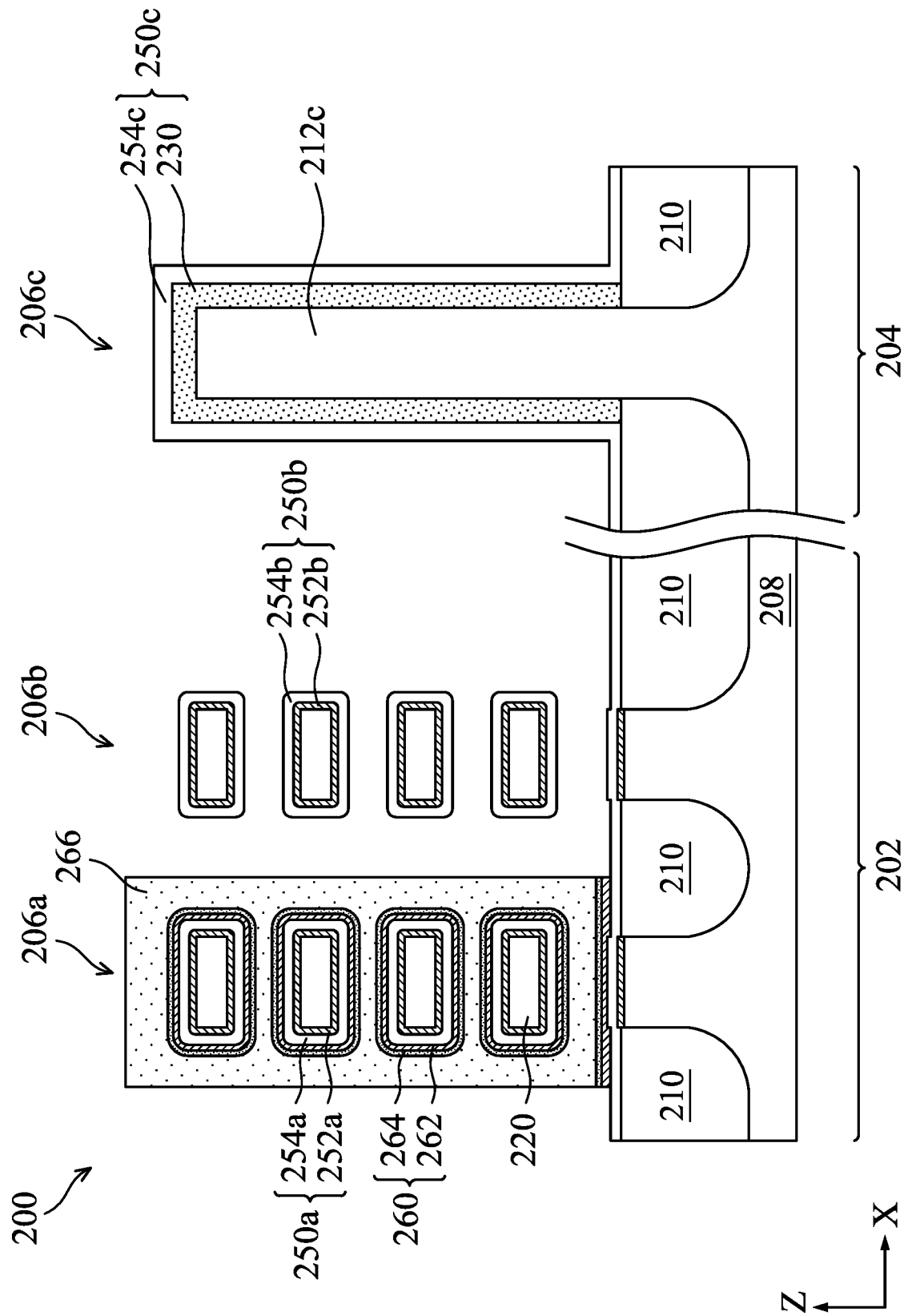
Figure 13:
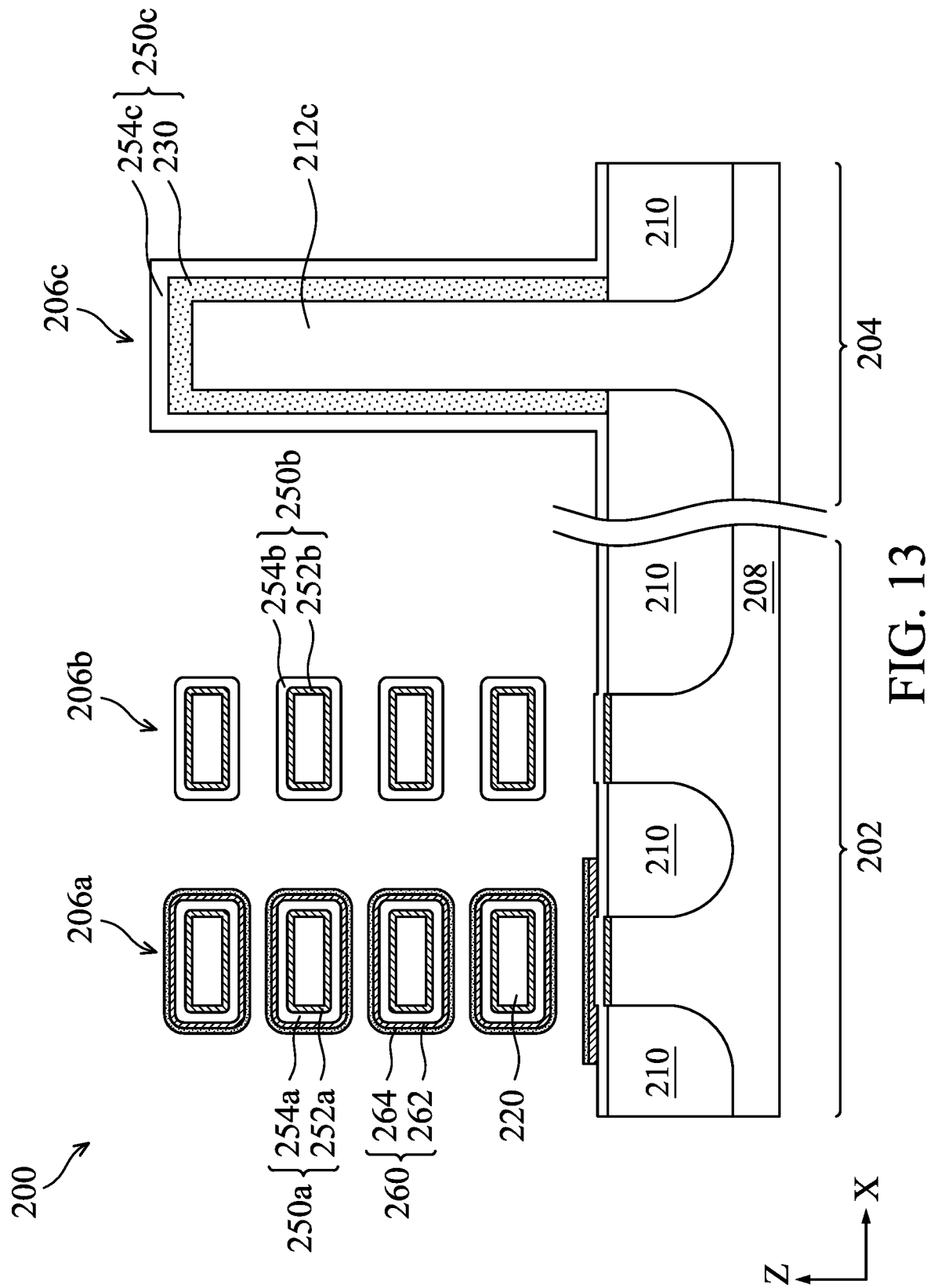

At operation 116, the method 100 (FIG. 2B) forms a mask layer 266 covering the GAA core device structure 206a and removes the thickness modulation layer 260 from the GGA core device structure 206b and the FinFET I/O device structure 206c, as shown in FIG. 12. The thickness modulation layer 260 may be removed, for example, by wet etching, dry etching, reactive ion etching, or other suitable etching methods. During this operation, the mask layer 266 covers the thickness modulation layer 260 on the gate dielectric layer 250a. In some embodiments, the mask layer 266 is a photoresist layer, such as a bottom antireflective coating (BARC) layer. After operation 108, mask layer 248 may be removed, such as by etching, ashing, or resist stripping. Alternatively, in another embodiment, the method 100 (FIG. 2C) may skip operations 114 and 116, but perform operation 118 following operation 112. Operation 118 form a mask layer (not shown) covering the GGA core device structure 206b and the FinFET I/O device structure 206c, leaving the GAA core device structure 206a exposed instead. Operation 120 deposits the thickness modulation layer 260 wrapping the gate dielectric layer 250a of the GAA core device structure 206a, which may be substantially similar to operation 114 as discussed above. After operation 120, the mask layer (not shown) may be removed, such as by etching, ashing, or resist stripping. In either embodiment (FIG. 2B or 2C), at this point, the thickness modulation layer 260 remains only on the gate dielectric layer 250a of the GAA core device structure 206a, as shown in FIG. 13.

At operation 122, the method 100 (FIG. 2D) performs an annealing process (represented by arrows 270 in FIG. 14) to initiate and enable the oxygen scavenging. The scavenging anneal may be performed using spike annealing, with the time duration being milliseconds, for example, between about 10 milliseconds and about 500 milliseconds. The temperatures of the respective wafer may be in the range between about 400° C. and about 1100° C. In accordance with some exemplary embodiments, the temperature is in the range between about 700° C. and about 1,000° C.

Figure 14:
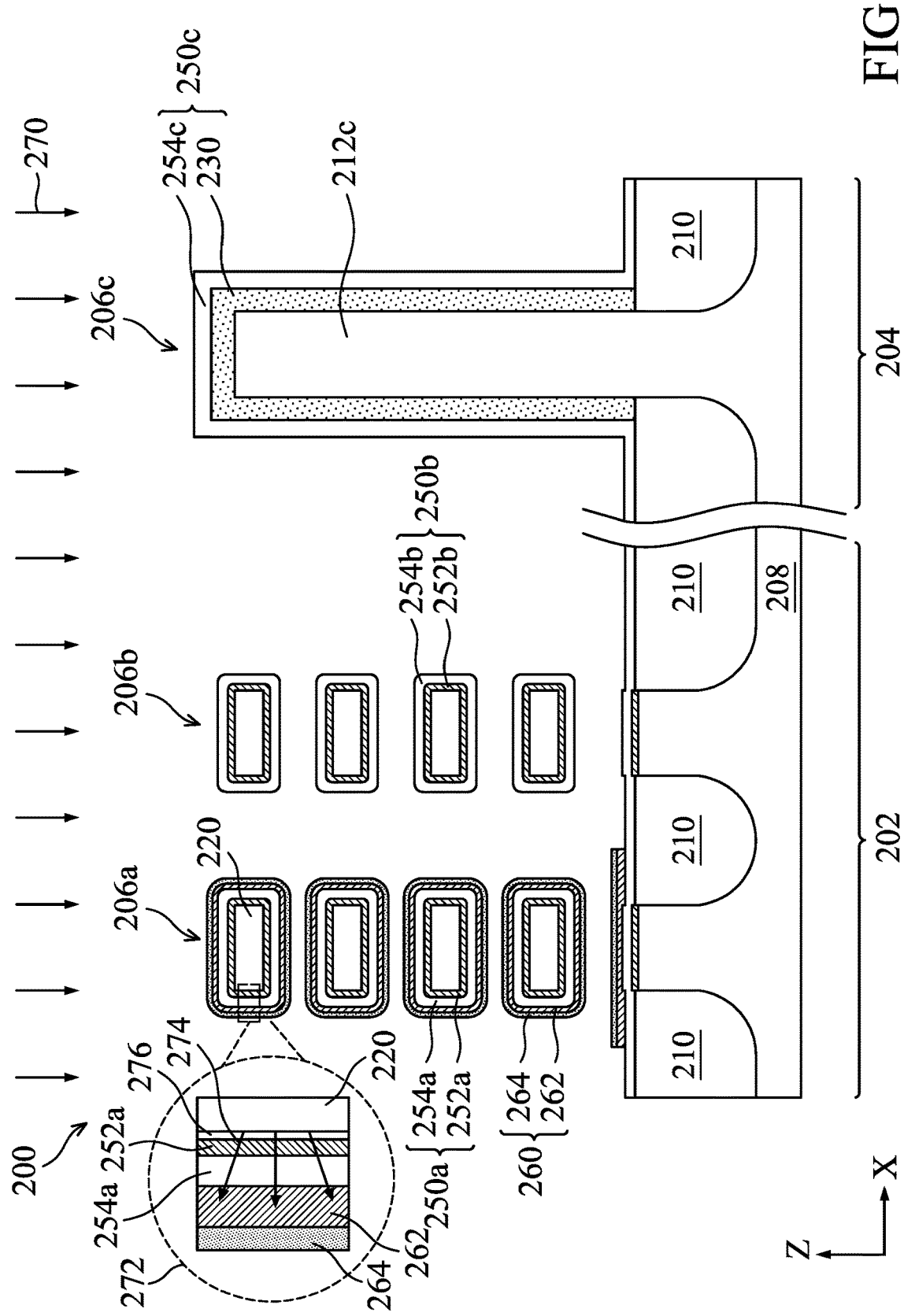

The oxygen scavenging process deprives oxygen from at least the bottom portion of the interfacial layer 252a, and hence the silicon in the interfacial layer 252a remains to form an additional silicon layer on top of the crystalline silicon layer of the nanowire 220. FIG. 14 illustrates a magnified view of a portion 272. Arrows 274 are shown to indicate the movement of oxygen atoms due to the scavenging. Accordingly, amorphous silicon layer 276 is formed. The additional silicon layer is formed of the remaining silicon of the interfacial layer 252a after oxygen is scavenged from the bottom portion of the interfacial layer 252a. The middle portion of interfacial layer 252a may remain after the scavenging process, or alternatively, no interfacial layer 252a remains after the scavenging.

During the scavenging anneal process, the high-k dielectric layer 254a may intermix with the top portion of the interfacial layer 252a and the oxygen scavenged from the bottom portion of the interfacial layer 252a to form an intermix compound, which may be a metal silicate. The intermix compound is likely to have increased oxygen content. For example, when the high-k dielectric layer 254a comprises $HfO_2$, intermix compound comprises hafnium silicate ($HfSiO_4$). When the high-k dielectric layer 254a comprises ZrO2, intermix compound comprises zirconium silicate (ZrSiO4).

Figure 15:
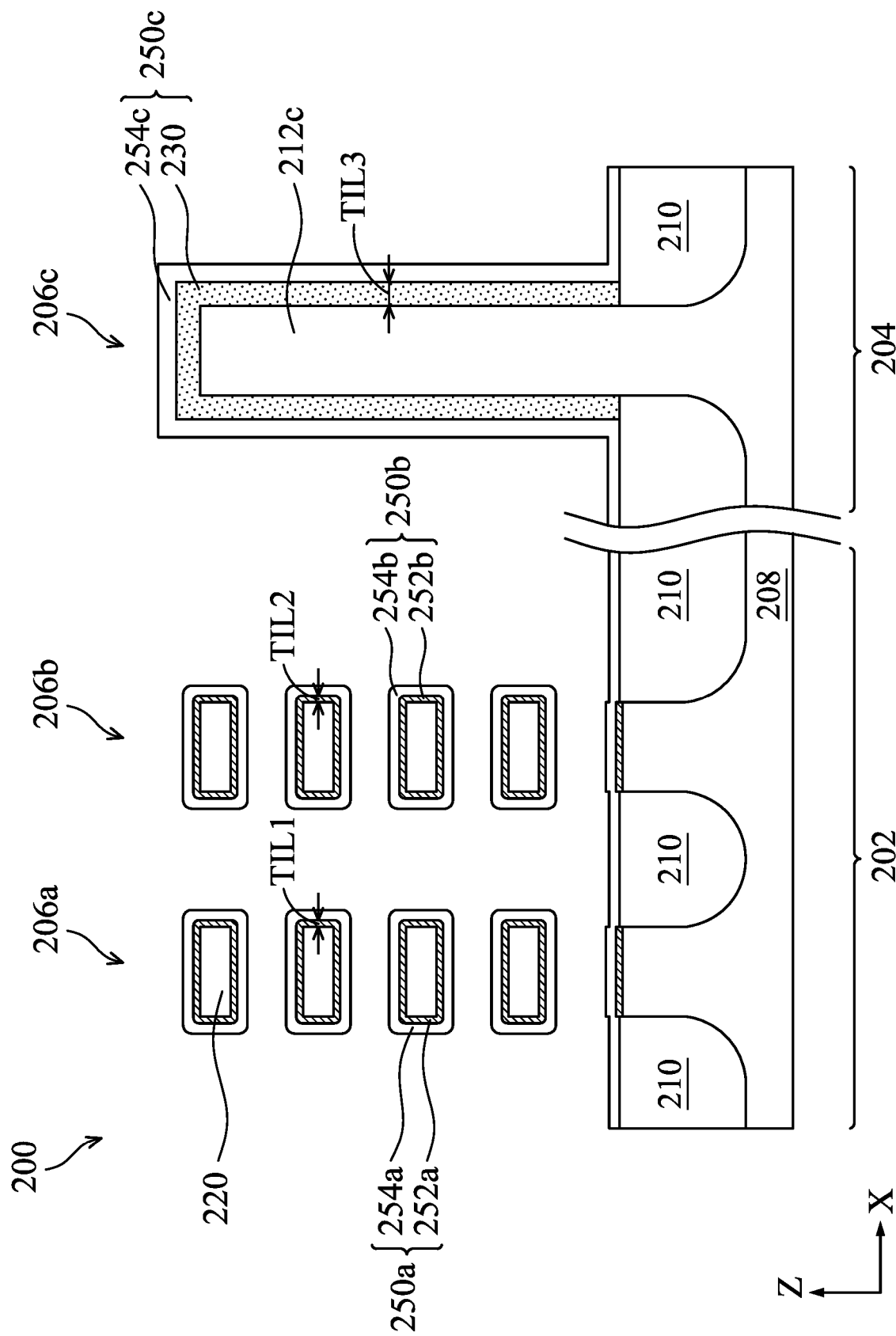
Figure 16:
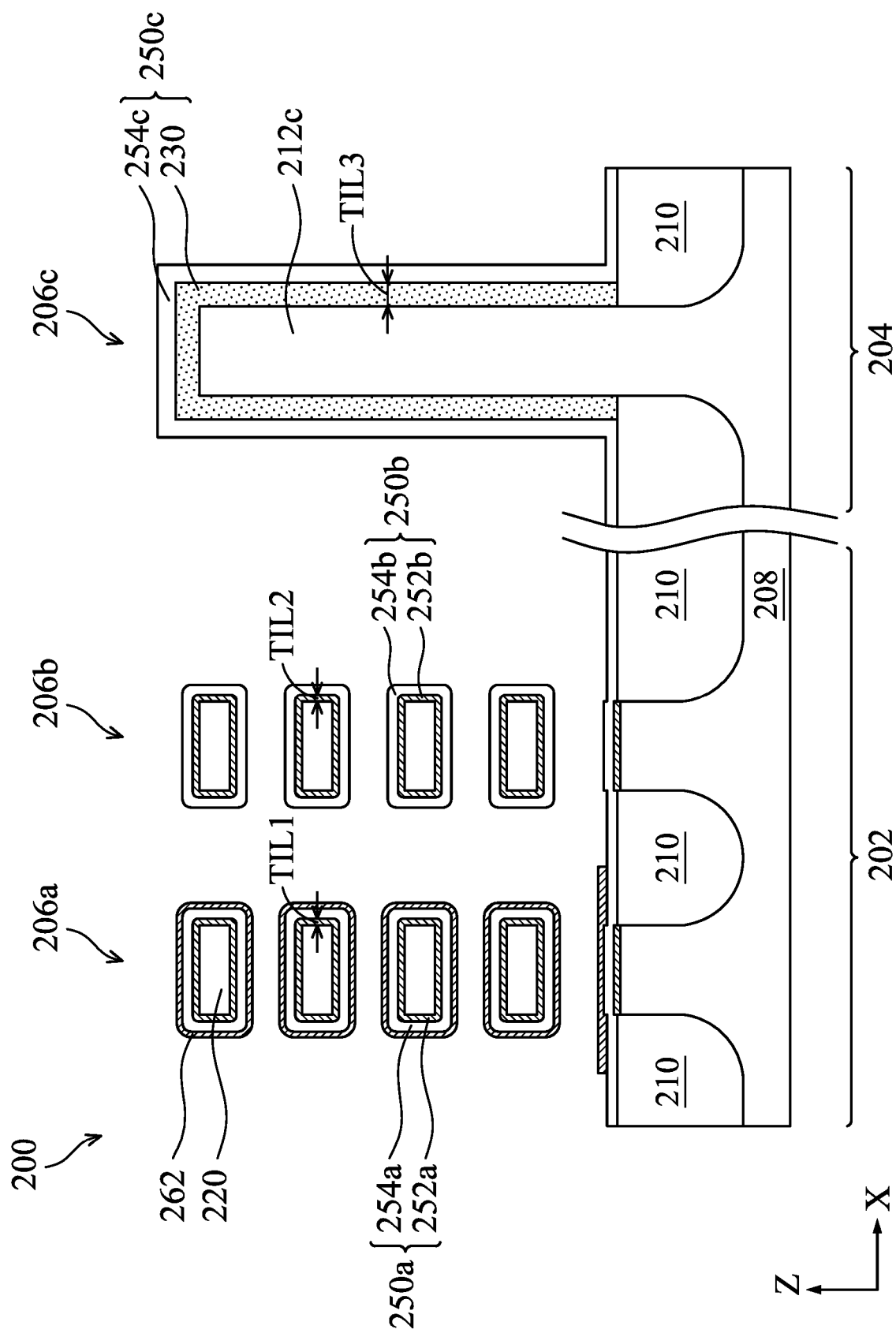

After the scavenging annealing process, at operation 124, the method 100 (FIG. 2D) removes at least the capping layer 264 in a selective etching process. The oxygen-scavenging layer 262 may also be removed, or may be left un-removed. The etching process can include dry etching, wet etching, reactive ion etching (RIE), and/or other suitable processes. In the embodiments in which the nanowire pitch is very small, such as smaller than about 10 nm, the oxygen-scavenging layer 262 is more likely to be removed to improve the subsequent gate electrode layer filling, such as shown in FIG. 15. In accordance with alternative embodiments, the oxygen-scavenging layer 262 is not removed, as shown in FIG. 16.

The oxygen scavenging process chemically reduces the interfacial layer 252a, resulting in the interfacial layer 252a with a reduced thickness or may even be eliminated (fully converted). The thickness TIL1 of the interfacial layer 252a may reduce by over 20%. In some embodiments, TIL1 after the oxygen scavenging process is less than or equal to about 11 Å, while TIL2 remains substantially the same, such as in a range from about 12 Å to about 15 Å, and TIL3 also remains substantially the same, such as in a range from about 20 Å to about 50 Å. Thickness of the high-k dielectric layer 254 may remain substantially the same as a blanket layer over core area and I/O area. Nonetheless, by reducing thickness of the interfacial layer 252a and keeping (and/or increasing at operation 112) original thick oxide layer 230, the gate dielectric layer 250a has a first CET thickness which is the thinnest suiting high-speed application, the gate dielectric layer 250b has a second CET thickness which is medium suiting low-power and/or low-leakage application, and the gate dielectric layer 250c has the thickest CET thickness suiting high-voltage application.

In an alternative embodiment, the thickness modulation layer 260 is a single layer without the capping layer 264 and wraps nanowires 220 of the GAA core device structure 206b instead of the GAA core device structure 206a, such as by protecting the GAA core device structure 206a and the FinFET I/O device structure 206c under a mask layer. In this alternative embodiment, the single layer is an oxide regrowth assisting layer that absorb oxygen from ambient atmosphere and transfers to interfacial layer 252b underneath. The oxide regrowth assisting layer may comprise metal or metal compound that has less affinity of oxygen than silicon in the interfacial layer 252b. In one embodiment, the oxide regrowth assisting layer includes tungsten (W). An annealing process is subsequently performed to activate the assisted oxide regrowth process to increase a thickness of the interfacial layer 252b. In this alternative embodiment, after the assisted oxide regrowth process, the gate dielectric layer 250b of the GAA core device structure 206b is thicker than that of the gate dielectric layer 250a of the GAA core device structure 206a but thinner than that of the FinFET I/O device structure 206c.

Figure 17:
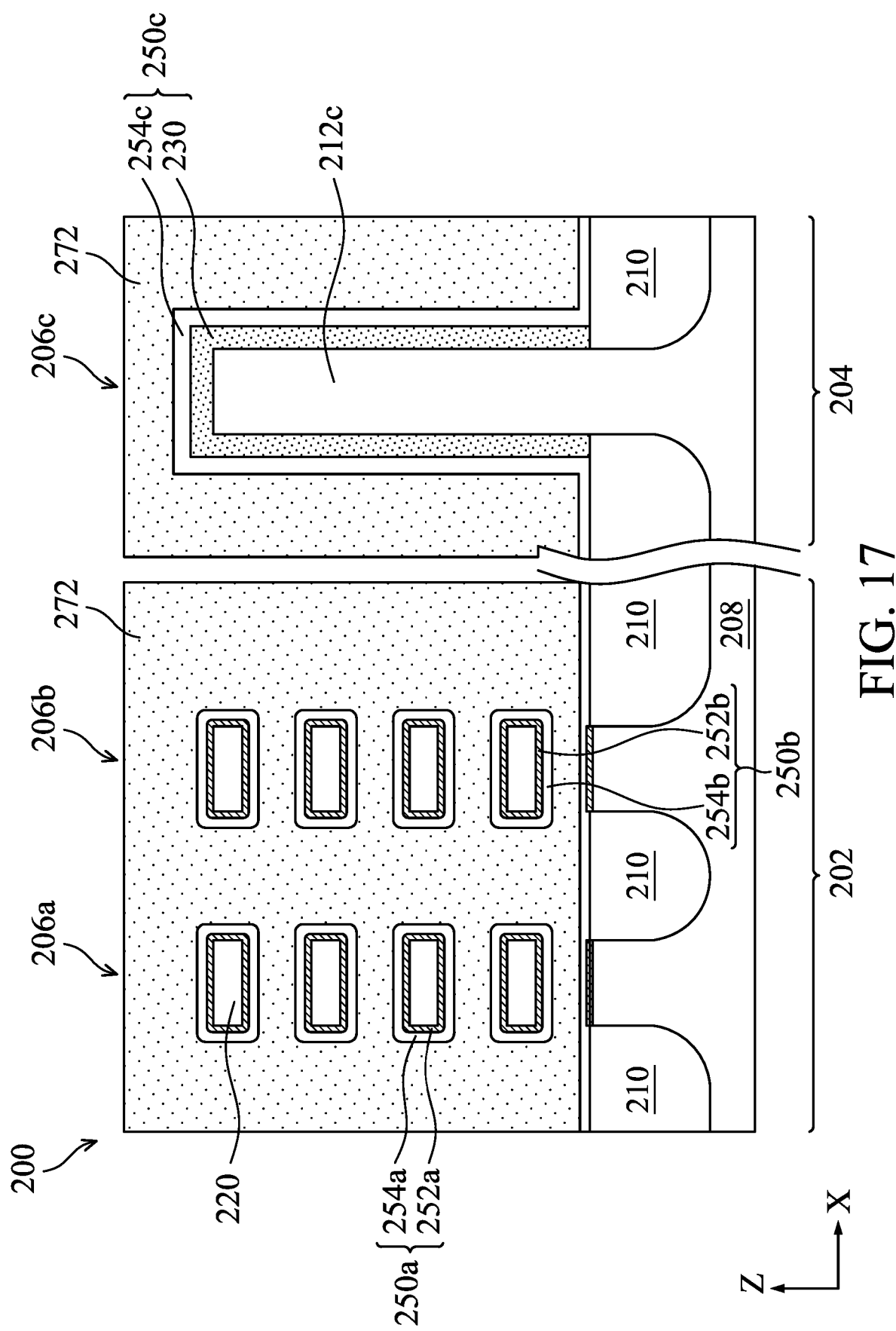
Figure 18:
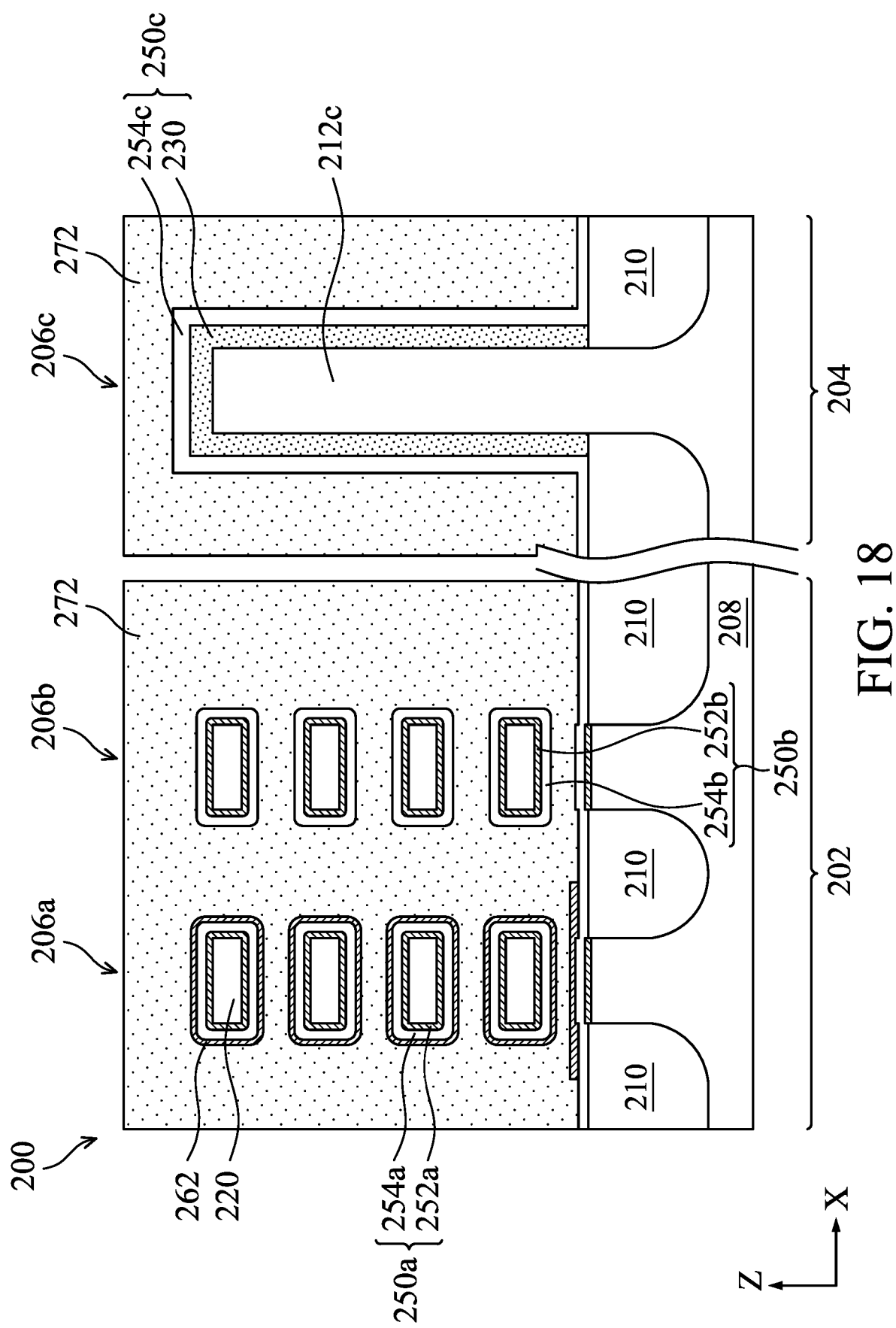

At operation 126, the method 100 (FIG. 2D) forms gate electrode layers 272 in gate trenches, wrapping gate dielectric layers 250a and 250b in the core area and over top and sidewall surfaces of the gate dielectric layer 250c in the I/O area. FIG. 17 shows the gate electrode layer 272 in direct contact with the gate dielectric layer 250a, in some embodiments. FIG. 18 shows the oxygen-scavenging layer 262 remaining between the gate electrode layer 272 and the gate dielectric layer 250a, in some other embodiments. In the illustrated embodiments, the GAA core device structures 206a and 206b are adjacent and share the same gate electrode layer, while the FinFET I/O device structure 206c has a separate gate electrode layer. The gate electrode layer 272 is a conductive layer that includes one or more metal layers, such as work function metal layer(s), conductive barrier layer(s), and metal fill layer(s). The gate electrode layer 272 may be formed separately for n-type and p-type transistors which may use different metal layers. The work function metal layer may be a p-type or an n-type work function layer. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The gate electrode layer 272 may comprise multiple work function metal layers, such as a first metal layer and a second metal layer. As an example, the first metal layer may include TiN, and the second metal layer may include TiAl or other combinations of Ti, Ta, C, Al, such as TiAlC or TaAlC. The gate electrode layer 272 also includes a metal fill layer. The metal fill layer may include aluminum (Al), tungsten (W), cobalt (Co), and/or other suitable materials. In various embodiments, the metal fill layer of the gate electrode layer 272 may be formed by plating, ALD, PVD, CVD, e-beam evaporation, or other suitable process. In various embodiments, a CMP process may be performed to remove excessive metal from the metal layer of the gate stack, and thereby pro vide a substantially planar top surface.

At operation 128 of the method 100 (FIG. 2D), the semiconductor device 200 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 19:
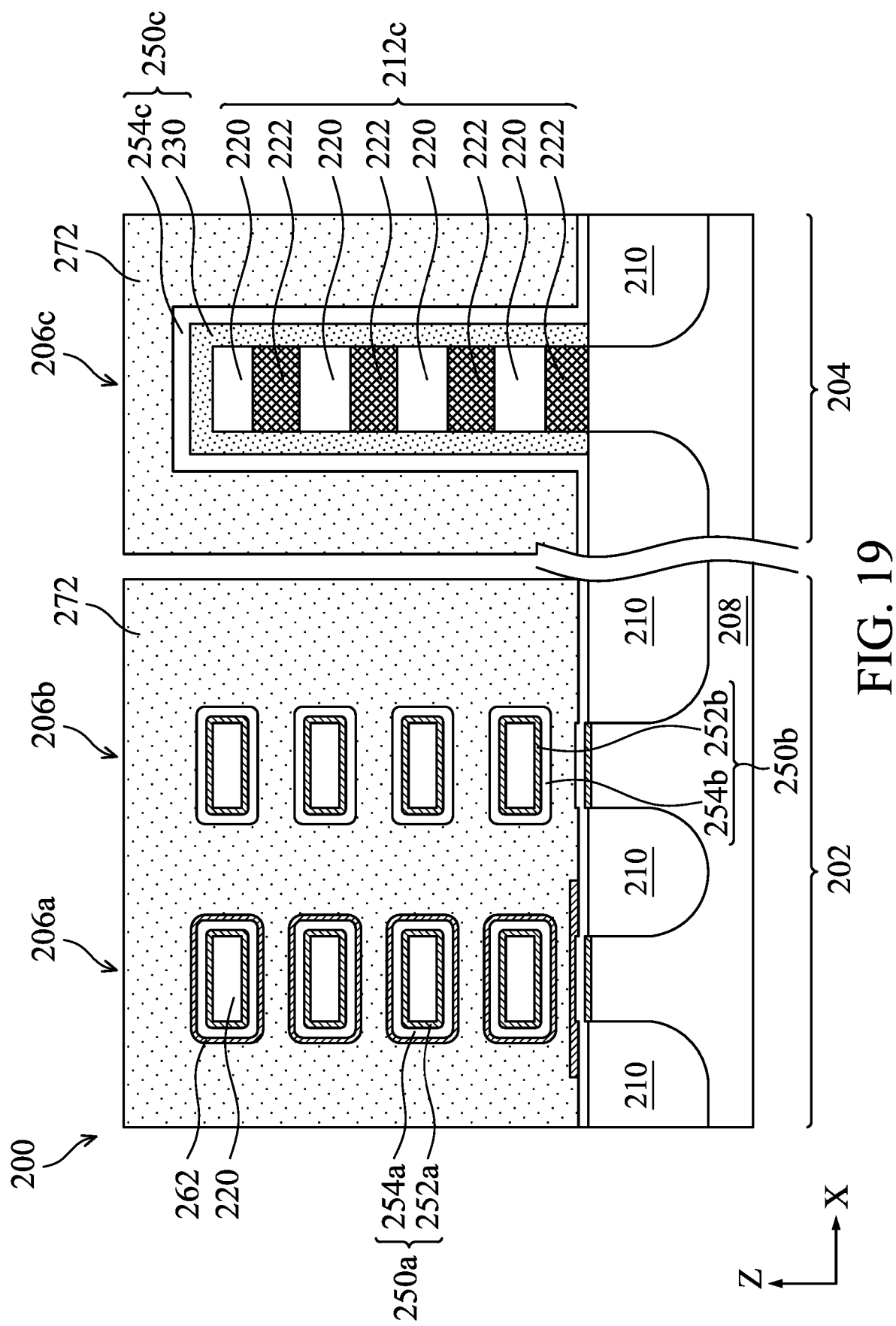
Figure 20:
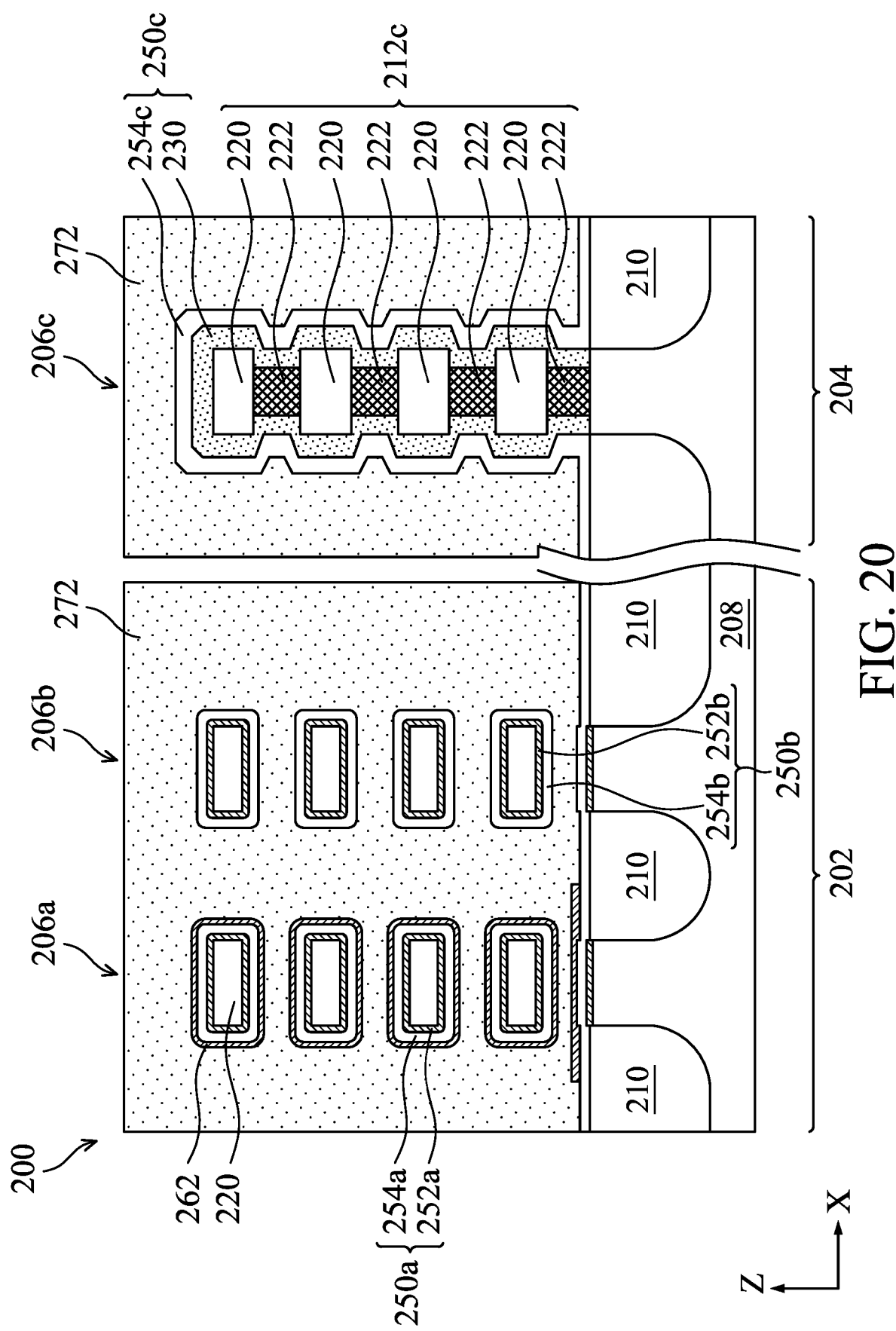

FIG. 19 shows another embodiment of the semiconductor device 200, where the fin 212c is a stacked fin including the semiconductor layers 220 and 222 alternately stacked. The material compositions of the semiconductor layers 220 and 222 are substantially similar to what have been described above associated with FIG. 3. The stacked fin 212c may be patterned from epitaxially grown stacked semiconductor layers together with the stacked fins 212a and 212b, while interfacial layer 230 protects the stacked fin 212c from a nanowire releasing process during operation 110. FIG. 20 shows yet another embodiment of the semiconductor device 200, where fin 212c is also a stacked fin including the semiconductor layers 220 and 222 alternately stacked. One difference with the embodiment in FIG. 19 is that semiconductor layers 220 and 222 in FIG. 20 may not have the same width along the x-direction. The width of the semiconductor layers 222 may be trimmed down in an etching process to expose more surface area of the semiconductor layers 220, for example, to expose more <110> or <100> surface of silicon layers to increase carrier mobilities.

Figure 21:
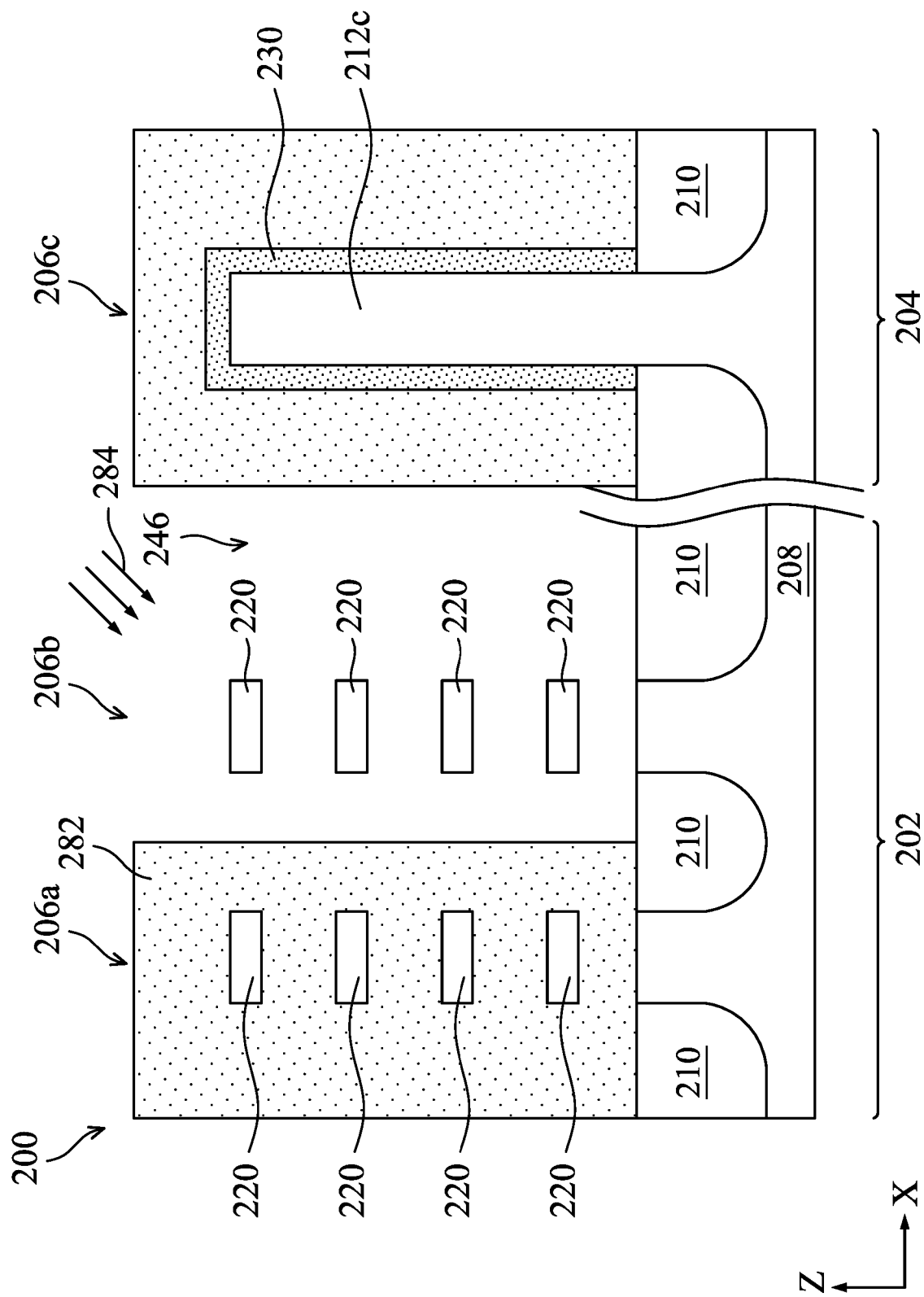
Figure 22:
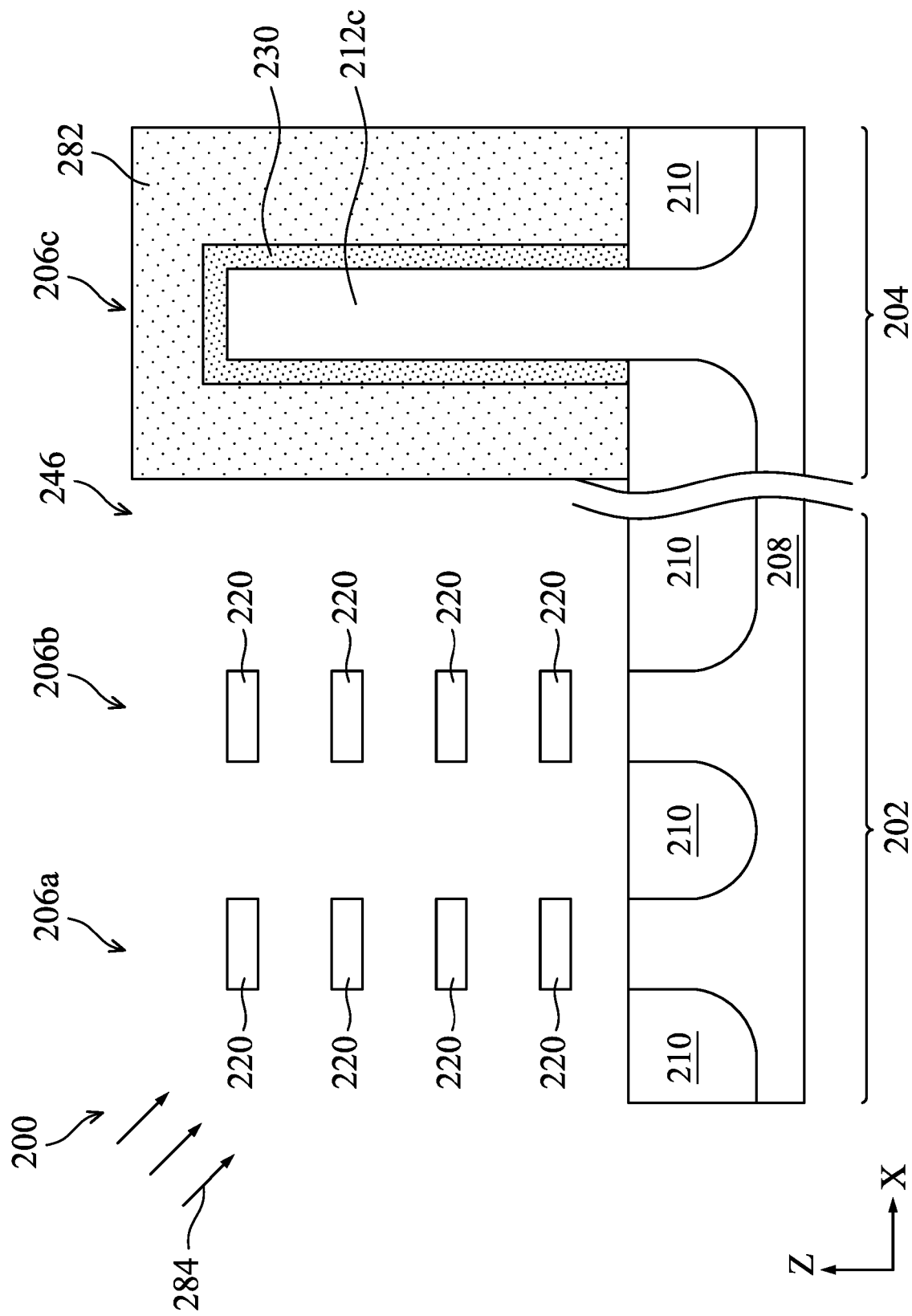

In another embodiment of the method 100, after operation 110 (FIG. 2A) forms stacked nanowires 220 in the gate trenches of the GAA core devices 206a and 206b, the method 100 may proceed to operation 130 (FIG. 2E) to perform an implantation process towards nanowires 220, as shown in FIG. 21. At operation 130, an implantation process is first performed towards nanowires 220 of the GAA core device 206b. More particularly, a mask layer 282 is formed to any suitable thickness by photolithography and patterning processes to overlay (or protect) a region of the substrate. Referring to FIG. 21, the mask layer 282 is formed over the devices areas of the GAA core device 206a and the FinFET I/O device 206c to avoid implantation. The mask layer 262 may be a photoresist layer and/or hard mask layer. When the GAA core device 206a is exposed to an implantation process (represented by arrows 284 in FIG. 21), dopants are implanted into the nanowires 220 of the GAA core device 206a within the gate trench 246. The implantation process 284 utilizes any suitable doping species, such as indium (In), argon (Ar), silicon (Si), and/or fluorine (F) doping species. In the illustrated embodiment, the doping species contain fluorine (F). The implantation process 284 includes any suitable implantation dose and/or energy. Subsequently, the mask layer 282 is removed from the GAA core device 206a, while still remains on the FinFET I/O device 206c, as shown in FIG. 22. When the GAA core devices 206a and 206b are both exposed to an implantation process 284, dopants are implanted into the nanowires 220 of the GAA core devices 206a and 206b within the gate trench 246. Under a longer exposure to the implantation process 284, nanowires 220 of the GAA core devices 206b receive a higher dose of doping species than that of the GAA core devices 206a. In the illustrated embodiment, nanowires 220 of the GAA core device 206b have a higher concentration of fluorine (F) than that of the GAA core device 206a, while the fin (or stacked fin) 212c is substantially free of doping species. The mask layer 282 may be subsequently removed.

Figure 2E:
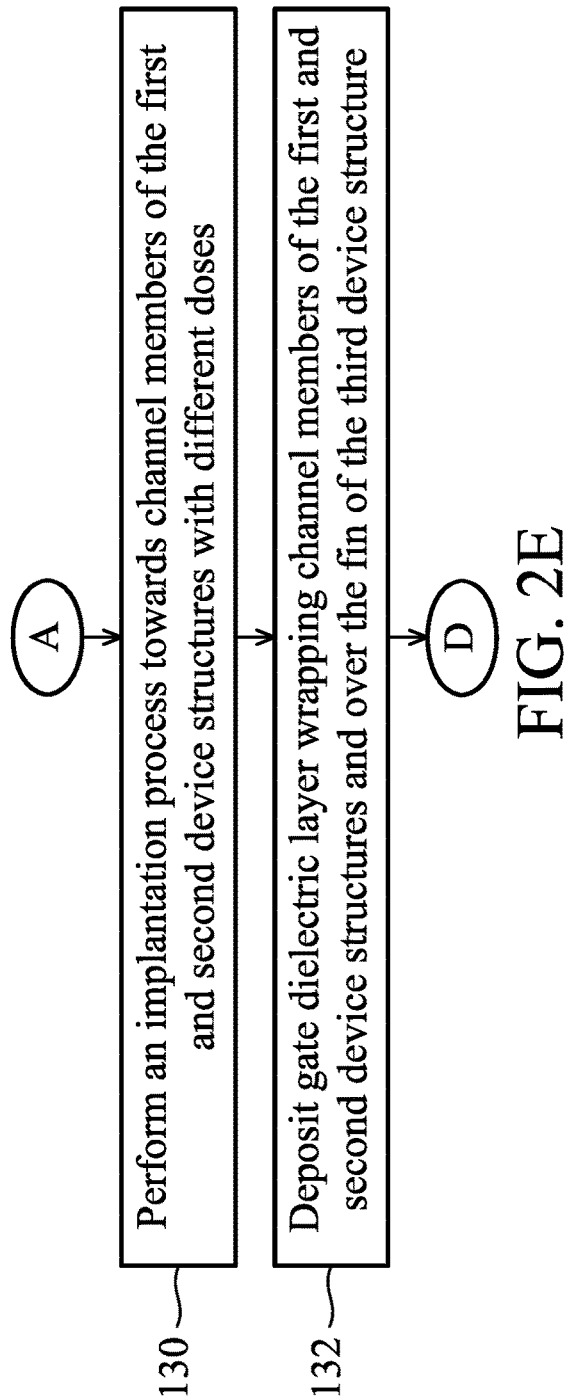
Figure 2F:
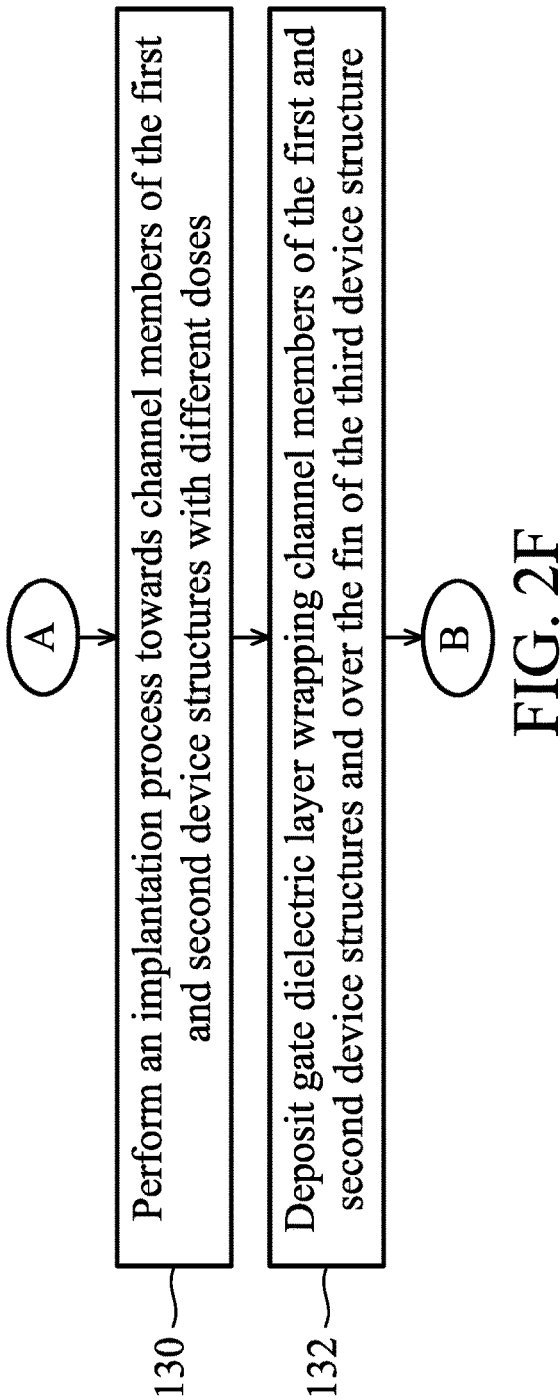

The implantation process 284 can be used to increase an oxidation rate, which provides for varied layer growth in gate dielectric layer deposition during operation 132 (FIG. 2E). By increasing the oxidation rate, the implantation process can affect the thicknesses of the interfacial layers, and thus the gate dielectric layers, for the core devices. In the present embodiment, the implantation process 284 increases the oxidation rate, such that when interfacial layers are grown over the nanowires 220 of the GAA core devices 206a and 206b, the thickness of the interfacial layer of the GAA core device 206b is greater than the thickness of the interfacial layer of the GAA core device 206a. The varying thickness can result from the increased oxidation rate caused by the implanted dopants in the channel members. In this embodiment of the method 100, after operations 130 and 132, the method 100 (FIG. 2E) may proceed directly to operation 126 for forming gate electrode layers. In yet another embodiment of the method 100, after operations 130 and 132, the method 100 (FIG. 2F) may continue to operation 114 (FIG. 2B) or operation 118 (FIG. 2C) to form thickness modulation layers to further tune thickness of the gate dielectric layers.

Although not intended to be limiting, one or more embodiments of the present disclosure provide many benefits to a semiconductor device and the formation thereof. For example, embodiments of the present disclosure provide GAA high-speed devices, GAA low-power/low-leakage devices, and FinFET high voltage devices on the same substrate and in the same integrated circuit. The GAA high-speed devices and the GAA low-power/low-leakage devices are placed in a core area of the IC, for example, for high-speed or low-power circuits, while the FinFET high voltage devices are placed in an I/O area of the IC for implementing I/O circuits or ESD circuits. The GAA high-speed devices, GAA low-power/low-leakage devices, and FinFET high-voltage devices have varying gate dielectric thickness to create performance differences in the three types of devices. The present embodiments enable circuit designers to optimize the circuits in different areas of the IC by choosing different types of devices.

In one exemplary aspect, the present disclosure is directed to a semiconductor device. The semiconductor device includes a substrate having a first region and a second region; a first transistor located in the first region, the first transistor having a first channel, a first gate dielectric layer over the first channel, and a first gate electrode layer over the first gate dielectric layer; a second transistor located in the first region, the second transistor having a second channel, a second gate dielectric layer over the second channel, and a second gate electrode layer over the second gate dielectric layer; and a third transistor located in the second region, the third transistor having a third channel, a third gate dielectric layer over the third channel, and a third gate electrode layer over the third gate dielectric layer, wherein a first thickness of the first gate dielectric layer is smaller than a second thickness of the second gate dielectric layer, wherein the second thickness of the second gate dielectric layer is smaller than a third thickness of the third gate dielectric layer. In some embodiments, the first channel of the first transistor includes a first plurality of channel members and the first gate dielectric layer wraps the first plurality of channel members, wherein the second channel of the second transistor includes a second plurality of channel members and the second gate dielectric layer wraps the second plurality of channel members, wherein the third channel of the third transistor includes a fin. In some embodiments, the first region is a core device region, wherein the second region is an input/output (I/O) device region. In some embodiments, the first gate dielectric layer includes a first interfacial layer and a first high-k dielectric layer over the first interfacial layer, wherein the second gate dielectric layer includes a second interfacial layer and a second high-k dielectric layer over the second interfacial layer, wherein the third gate dielectric layer includes a third interfacial layer and a third high-k dielectric layer over the third interfacial layer, wherein the first interfacial layer is thinner than the second interfacial layer and the second interfacial layer is thinner than the third interfacial layer. In some embodiments, the second interfacial layer is about 10% to about 40% thicker than the first interfacial layer. In some embodiments, the first transistor includes an oxygen-scavenging layer between the first gate dielectric layer and the first gate electrode layer, wherein the second gate dielectric layer is in direct contact with the second gate electrode layer. In some embodiments, the oxygen-scavenging layer includes a material selected from the group consisting of Ti, Ta, Si, TiN, TiSiN, TaN, TaSiN, and combinations thereof. In some embodiments, the first transistor includes an amorphous silicon layer between the first gate dielectric layer and the first channel, wherein the second gate dielectric layer is in direct contact with the second channel. In some embodiments, the first gate dielectric layer includes a high-k dielectric material and an intermix compound of the high-k dielectric material, silicon, and oxygen. In some embodiments, the first channel of the first transistor includes fluorine of a first concentration, the second channel of the second transistor includes fluorine of a second concentration, and the first concentration is smaller than the second concentration. In some embodiments, the third channel of the third transistor is substantially free of fluorine.

In another exemplary aspect, the present disclosure is directed to a semiconductor device. The semiconductor device includes a first gate-all-around (GAA) transistor including: a first plurality of channel members, a first interfacial layer wrapping the first plurality of channel members, a first high-k dielectric layer wrapping the first interfacial layer, and a first gate electrode layer wrapping the first high-k dielectric layer; a second GAA transistor including: a second plurality of channel members, a second interfacial layer wrapping the second plurality of channel members, a second high-k dielectric layer wrapping the second interfacial layer, and a second gate electrode layer wrapping the second high-k dielectric layer; and a fin field effect (FinFET) transistor including: a fin channel, a third interfacial layer over the fin channel, a third high-k dielectric layer over the third interfacial layer, and a third gate electrode layer over the third high-k dielectric layer, wherein the first interfacial layer is thinner than the second interfacial layer and the second interfacial layer is thinner than the third interfacial layer. In some embodiments, the first and second GAA transistors are both disposed in a core device region, and the FinFET transistor is disposed in an input/output (I/O) device region. In some embodiments, the first interfacial layer has a thickness less than or equal to about 11 Å, the second interfacial layer has a thickness between about 12 Å and about 15 Å, and the third interfacial layer has a thickness larger than or equal to about 20 Å. In some embodiments, the first and second high-k dielectric layers have substantially a same thickness. In some embodiments, the first GAA transistor includes an oxygen-scavenging layer between the first high-k dielectric layer and the first gate electrode layer, and the second high-k dielectric layer is in direct contact with the second gate electrode layer.

In another exemplary aspect, the present disclosure is directed to a method. The method includes providing a structure having a first plurality of channel members, a second plurality of channel members, and a fin, wherein the first and second pluralities of channel members are located in a core device region of an integrated circuit, and the fin is located in an input/output (I/O) device region of the integrated circuit; forming a first oxide layer wrapping the first and second pluralities of channel members and over the fin; removing the first oxide layer from the first and second pluralities of channel members; forming a second oxide layer wrapping the first and second pluralities of channel members; forming a high-k dielectric layer wrapping the second oxide layer in the core device region and over the first oxide layer in the I/O device region; forming a thickness modulation layer wrapping the high-k dielectric layer that wraps the first plurality of channel members; performing an annealing process to adjust a thickness of the second oxide layer that wraps the first plurality of channel members; removing at least a portion of the thickness modulation layer; and forming a gate electrode layer wrapping the high-k dielectric layer in the core device region and over the high-k dielectric layer in the I/O device region. In some embodiments, the thickness modulation layer is an oxygen-scavenging layer and the annealing process reduces the thickness of the portion of the second oxide layer. In some embodiments, the thickness modulation layer is an oxide regrowth assisting layer and the annealing process increases the thickness of the portion of the second oxide layer. In some embodiments, the method includes performing an implantation process on the core device region, wherein the first plurality of channel members receives a smaller implantation dose than the second plurality of channel members.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a first region and a second region;
   a plurality of nanostructures vertically stacked above the first region of the substrate;
   a first gate dielectric layer wrapping each of the nanostructures;
   a first gate electrode layer disposed on the first gate dielectric layer;
   a fin protruding from the second region of the substrate, wherein the fin includes alternating first and second semiconductor layers with different material compositions;
   a second gate dielectric layer disposed on top and sidewall surfaces of the fin; and
   a second gate electrode layer disposed on the second gate dielectric layer,
   wherein a thickness of the first gate dielectric layer is smaller than a thickness of the second gate dielectric layer.

2. The semiconductor device of claim 1, wherein the nanostructures and the first semiconductor layers include a same semiconductor material.

3. The semiconductor device of claim 2, wherein the semiconductor material is silicon.

4. The semiconductor device of claim 1, wherein in the fin a width of the first semiconductor layers is larger than a width of the second semiconductor layers.

5. The semiconductor device of claim 1, wherein the first region is a core device region, and the second region is an input/output (I/O) device region.

6. The semiconductor device of claim 1, further comprising:
   an oxygen-scavenging layer interposing the first gate dielectric layer and the first gate electrode layer, wherein the second gate dielectric layer is in physical contact with the second gate electrode layer.

7. The semiconductor device of claim 6, wherein the oxygen-scavenging layer includes a material selected from the group consisting of Ti, Ta, Si, TiN, TiSiN, TaN, TaSiN, and combinations thereof.

8. The semiconductor device of claim 1, further comprising:
an amorphous silicon layer interposing the first gate dielectric layer and the nanostructures.

9. The semiconductor device of claim 1, wherein the nanostructures include fluorine, and the fin is substantially free of fluorine.

10. The semiconductor device of claim 1, wherein the nanostructures are first nanostructures, the semiconductor device further comprising:
a plurality of second nanostructures vertically stacked above the first region of the substrate;
a third gate dielectric layer wrapping each of the second nano structures; and
a third gate electrode layer disposed on the third gate dielectric layer,
wherein a thickness of the third gate dielectric layer is smaller than the thickness of the first gate dielectric layer.

11. A semiconductor device, comprising:
a gate-all-around (GAA) transistor including:
a plurality of channel members vertically stacked,
a first interfacial layer wrapping the channel members,
a first high-k dielectric layer wrapping the first interfacial layer, and
a first gate electrode layer wrapping the first high-k dielectric layer; and
a fin field effect (FinFET) transistor including:
a fin channel,
a second interfacial layer over the fin channel,
a second high-k dielectric layer over the second interfacial layer, and
a second gate electrode layer over the second high-k dielectric layer,
wherein the first interfacial layer is thinner than the second interfacial layer.

12. The semiconductor device of claim 11, wherein a thickness of the first interfacial layer is not larger than about 11 Angstrom (Å), and a thickness of the second interfacial layer is in a rage from about 20 Å to about 50 Å.

13. The semiconductor device of claim 11, wherein a total thickness of the first interfacial layer and the first high-k dielectric layer is smaller than a total thickness of the second interfacial layer and the second high-k dielectric layer.

14. The semiconductor device of claim 11, wherein the GAA transistor further includes an oxygen-scavenging layer between the first high-k dielectric layer and the first gate electrode layer, and the second high-k dielectric layer is in direct contact with the second gate electrode layer.

15. A semiconductor device, comprising:
a first gate-all-around (GAA) transistor, wherein the first GAA transistor includes:
a plurality of first channel members,
a first gate dielectric layer wrapping each of the first channel members,
an oxygen-scavenging layer wrapping the first gate dielectric layer, and
a first gate electrode layer wrapping the oxygen-scavenging layer; and
a second gate-all-around (GAA) transistor, wherein the second GAA transistor includes:
a plurality of second channel members,
a second gate dielectric layer wrapping each of the second channel members, and
a second gate electrode layer wrapping and in direct contact with the second gate dielectric layer.

16. The semiconductor device of claim 15, wherein the first gate dielectric layer is thinner than the second gate dielectric layer.

17. The semiconductor device of claim 15, further comprising:
a fin field effect (FinFET) transistor, wherein the FinFET transistor includes:
a fin,
a third gate dielectric layer over sidewalls and a top surface of the fin, and
a third gate electrode layer over the third gate dielectric layer.

18. The semiconductor device of claim 17, wherein the first gate dielectric layer is thinner than the second gate dielectric layer, and the second gate dielectric layer is thinner than the third gate dielectric layer.

19. The semiconductor device of claim 17, wherein the first and second GAA transistors are located in a core region, and the FinFET transistor is located in an input/output (I/O) region.

20. The semiconductor device of claim 17, wherein the fin includes a stack of interleaved first semiconductor layers and second semiconductor layers of different material compositions.

* * * * *